US012810821B1

(12) United States Patent
Paik et al.

(10) Patent No.: US 12,810,821 B1
(45) Date of Patent: Nov. 24, 2026

(54) GATE DRIVER CIRCUIT CONFIGURATION FOR DISPLAY DEVICE

(71) Applicant: Microsoft Technology Licensing, LLC, Redmond, WA (US)

(72) Inventors: Younghun Paik, Bothell, WA (US); Hyungsoo Kim, Bellevue, WA (US); Ying Zheng, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 19/238,235

(22) Filed: Jun. 13, 2025

(51) Int. Cl.

| | |
|---|---|
| ***G09G 3/36*** | (2006.01) |
| ***G09G 3/3266*** | (2016.01) |
| ***G11C 19/28*** | (2006.01) |

(52) U.S. Cl.
CPC ......... *G09G 3/3677* (2013.01); *G09G 3/3266* (2013.01); *G11C 19/28* (2013.01); *G09G 2310/0286* (2013.01); *G09G 2310/08* (2013.01); *G09G 2330/021* (2013.01)

(58) Field of Classification Search
CPC ..... G09G 3/3677; G09G 3/3266; G11C 19/28
See application file for complete search history.

(56) References Cited

U.S. PATENT DOCUMENTS

2017/0365204 A1* 12/2017 Choi .................... G09G 3/2092
2025/0218387 A1* 7/2025 Shin ..................... G09G 3/3266

* cited by examiner

*Primary Examiner* — Scott D Au
(74) *Attorney, Agent, or Firm* — Alleman Hall LLP

(57) ABSTRACT

A gate driver circuit for a display device includes a plurality of shift register circuits configured to sequentially generate carry signals. A plurality of output circuits are respectively associated with the plurality of shift register circuits, each output circuit configured to generate a gate signal based at least in part on the carry signals. Each shift register circuit includes a plurality of circuit elements configured to: receive an input carry signal and a clock signal, generate an internal state signal at an indicator node based at least in part on the input carry signal and the clock signal, generate an output carry signal based at least in part on the internal state signal, prevent a through current path between a high potential voltage supply and a low potential voltage supply by disabling at least one transistor when the internal state signal is active.

18 Claims, 19 Drawing Sheets

GATE DRIVER CIRCUIT CONFIGURATION FOR DISPLAY DEVICE

BACKGROUND

Display devices, such as liquid crystal displays (LCDs) and organic light-emitting diode (OLED) panels, commonly employ active-matrix architectures in which each pixel is addressed via a combination of gate lines and data lines. Gate driver circuits are used to sequentially activate the gate lines, enabling the transfer of image data to corresponding rows of pixels.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A gate driver circuit for a display device includes a plurality of shift register circuits configured to sequentially generate carry signals. A plurality of output circuits are respectively associated with the plurality of shift register circuits, each output circuit configured to generate a gate signal based at least in part on the carry signals. Each shift register circuit includes a plurality of circuit elements configured to: receive an input carry signal and a clock signal, generate an internal state signal at an indicator node based at least in part on the input carry signal and the clock signal, generate an output carry signal based at least in part on the internal state signal, prevent a through current path between a high potential voltage supply and a low potential voltage supply by disabling at least one transistor when the internal state signal is active.

DETAILED DESCRIPTION

Figure 1:
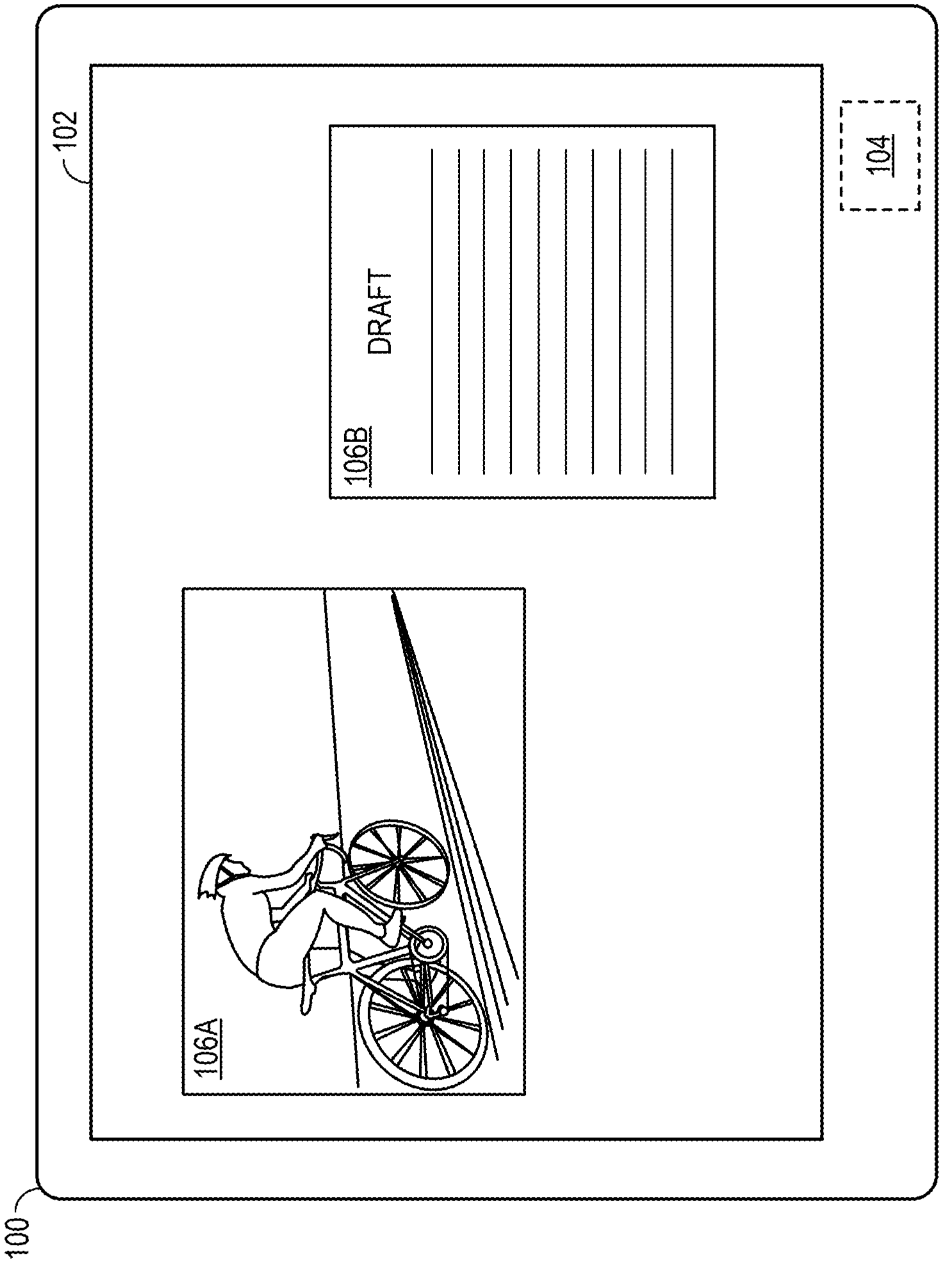
FIG. 1 schematically depicts an example display device used to present image content.

Display devices often include a plurality of image-forming components, such as pixels, arranged in rows and columns. Each row of pixels is associated with a gate line, and each column is associated with a data line. To display an image, gate driver circuits sequentially activate the gate lines, enabling the corresponding pixels in each row to receive image data from the data lines. This scanning operation is controlled using a series of shift register circuits that generate timing signals (often referred to as carry signals), which are used to control a corresponding series of output circuits. When activated, the output circuits generate gate signals that are applied to the gate lines and cause activation of the image-forming components in a corresponding row.

In some implementations, shift register circuits are configured such that internal circuit nodes are charged and discharged in response to clock signals and carry signals. However, in certain circuit configurations, power is unnecessarily dissipated due to the presence of a through current path between a high potential voltage supply and a low potential voltage supply. This occurs, for example, when multiple transistors are simultaneously conducting in a way that connects the supply rails directly through the circuit. These transient conduction paths can lead to increased power consumption and reduced efficiency, known as short circuit current.

Accordingly, the present disclosure describes example arrangements for circuit elements of a gate driver circuit. The gate driver circuit includes a plurality of shift register circuits configured to sequentially generate carry signals, and a plurality of output circuits respectively associated with the plurality of shift register circuits. Each output circuit is configured to generate a gate signal for a corresponding row of image-forming components based at least in part on the carry signals. The functionality of each shift register circuit is implemented by a corresponding plurality of circuit elements. These circuit elements (e.g., transistors, capacitors, etc.) are configured to receive an input carry signal and a clock signal, generate an internal state signal at an indicator node based at least in part on the input carry signal and the clock signal, and generate an output carry signal based at least in part on the internal state signal. Notably, the circuit elements are arranged in such a way as to prevent a through current path between a high potential voltage supply and a low potential voltage supply, by disabling at least one transistor when the internal state signal is active.

This configuration provides several technical benefits. By selectively disabling one or more transistors when the internal state signal is active, the circuit prevents the formation of a direct current path between power supply rails during active operation. This reduces unnecessary power consumption and improves overall energy efficiency. For instance, in some examples, power savings of 4-8% may be achieved. In addition, the use of dynamically generated carry signals based at least in part on internal state transitions and controlled clocking enables more precise timing control and supports reliable scanning of gate lines in the display panel. Furthermore, the revised shift register maintains its compatibility with other types of gate driver circuitry, which beneficially improves the flexibility and applicability of the circuit arrangements described herein.

FIG. 1 schematically depicts an example computing device 100, which includes a display device 102. In this example, the display device is an integral component of a larger computing device, which generates image content for presentation using the display device. In other examples, this need not be the case. For instance, the display device may be external to, and operatively coupled with, a separate computing device or other image source. These may include, as examples, a desktop or laptop computer, a mobile phone, a tablet, a wearable device, a set-top box, a gaming console, and/or any other system configured to output image content to a display. The image source may communicate with the display device using a suitable wired or wireless interface, and may provide image data in any suitable encoding format. In some examples, a display device as described herein may be implemented as, or in tandem with, computing system 1100 described below with respect to FIG. 11.

In the example of FIG. 1, computing device 100 includes a processing component 104, which generates image data for display by the display device. The processing component may take any suitable form, including but not limited to a central processing unit (CPU), graphics processing unit (GPU), neural processing units (NPUs), application-specific integrated circuit (ASIC), system-on-chip (SoC), and/or any combination thereof. In some examples, the processing component may include dedicated image processing hardware. In other examples, image data may be generated by software executing on general-purpose processing circuitry. The image data generated by the processing component may represent static images, video content, graphical user interfaces, and/or other visual elements, and may be transmitted to the display device either directly or through an intermediate display controller or timing controller. In some examples, processing component 104 may be implemented as logic subsystem 1102 described below with respect to FIG. 11.

Similarly, the display device itself may be implemented in any suitable way. For instance, the display device may include a liquid crystal display (LCD), an organic light-emitting diode (OLED) display, a microLED display, and/or any other suitable type of panel technology capable of rendering visual content. The display device may include various supporting circuitry, such as gate driver integrated circuits (ICs), source driver ICs, timing controllers, backlight drivers, power management components, etc. The architecture of the display device may support various resolutions, refresh rates, color depths, etc., depending on the application context and performance requirements.

In the example of FIG. 1, the display device is used to present two different windows 106A and 106B including image content. Window 106A includes video content that is updating frequently. For instance, some to all of the image pixels of the video shown in window 106A may change from one frame to another. By contrast, window 106B includes a text document that updates less frequently—e.g., from one frame to another, few if any of the pixels in window 106B may change, depending on the user's interactions with the computing device. In some examples, the underlying image-forming components may be refreshed at different rates depending on the nature of the image content, which can beneficially conserve electrical power of the display device.

It will be understood that this specific scenario is non-limiting and highly simplified, and that a display device as described herein may be used to display any suitable type of imagery. The displayed imagery may in some cases fill substantially the entire display area, rather than being confined to two individual windows as shown in FIG. 1. Furthermore, image-forming components may be updated at any suitable refresh rate. In some cases, each of the image-forming components of the display device may be updated at the same refresh rate. Alternatively, in some cases, two or more display regions may be defined, which are updated at different refresh rates depending on the nature of the underlying image content.

Figure 2:
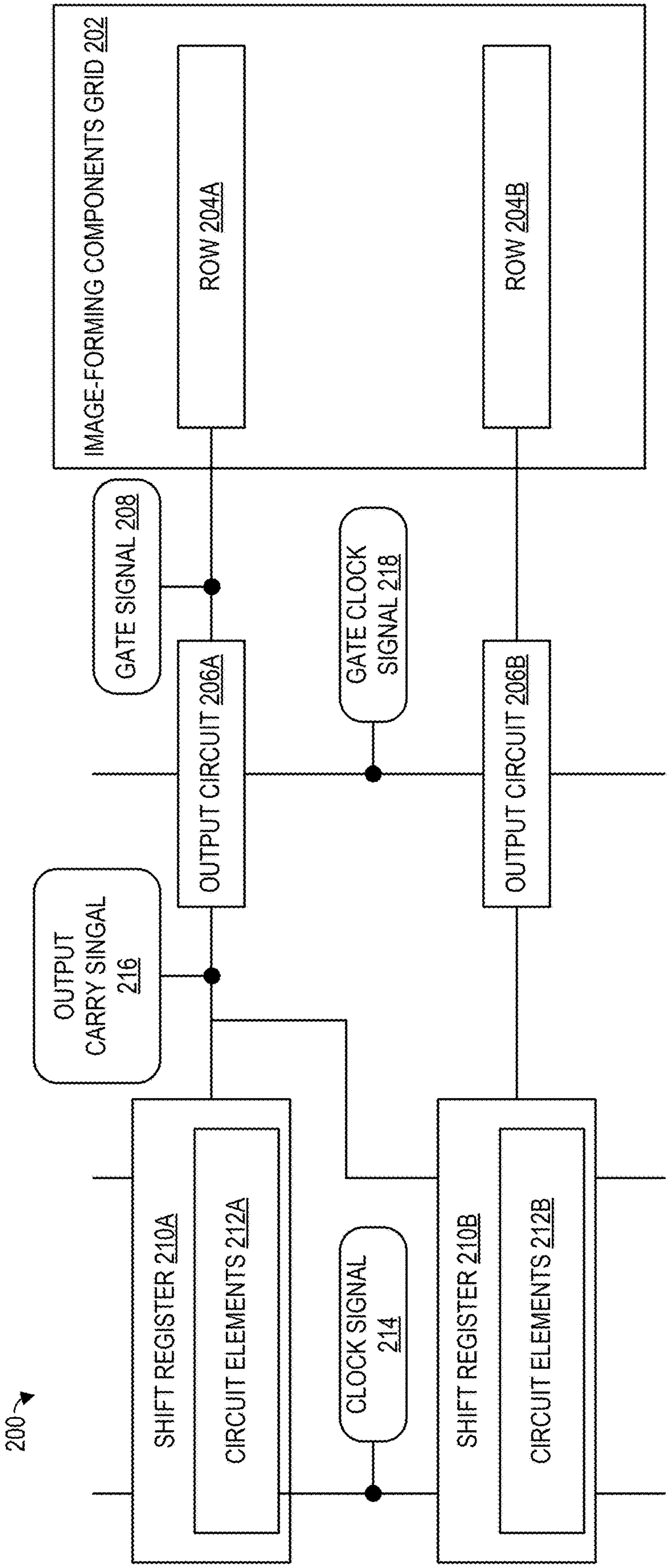
FIG. 2 schematically shows aspects of gate driving circuitry useable to drive image-forming components of a display device.

FIG. 2 schematically illustrates aspects of an example gate driver circuit 200 of a display device. For instance, gate driver circuit 200 may be implemented as part of display device 100 and used to facilitate display of graphical image content. It will be understood that gate driver circuit 200 is highly simplified for the sake of explanation, and may include any of a wide variety of additional or alternative components not shown in FIG. 2.

In FIG. 2, the gate driver circuit includes a plurality of image-forming components 202. These may take any suitable form, and may be implemented and arranged in any suitable way. In some examples, the image-forming components 202 comprise pixels and/or sub-pixels configured to modulate light in response to electrical signals. The pixels may be implemented using various technologies, including liquid crystal display (LCD) structures in which liquid crystal material modulates light passing through a backlight in response to a driving voltage, or organic light-emitting diode (OLED) structures in which organic emissive layers generate light when current is applied. In other examples, the pixels may be implemented using microLEDs, electrophoretic elements, and/or other suitable image-forming technologies. Each pixel may include one or more thin-film transistors (TFTs) for controlling the application of voltage or current to the light-modulating or light-emitting component. The structure, arrangement, and driving requirements of the pixels may vary depending on the display technology employed.

In some examples, the image-forming components may be arranged in a grid that includes a plurality of rows and columns. Two rows 204A and 204B of image-forming components are schematically represented in FIG. 2. As shown, each row of image-forming components is operatively coupled with a corresponding output circuit 206A/

206B. In other words, the gate driver circuit includes a plurality of output circuits, which are configured to activate corresponding rows of image-forming components by outputting gate signals. In FIG. 2, output circuit 206A outputs a gate signal 208, which may activate image-forming components in row 204A—e.g., the gate signal may cause the image-forming components to change their optical state based at least in part on data signals carried on corresponding data lines.

In some examples, the output circuits (and therefore the corresponding rows of image-forming components) may be activated sequentially according to a scanning operation. This scanning operation may be controlled by a plurality of shift register circuits. Each shift register circuit may generate a timing signal, such as a carry signal, that triggers the corresponding output circuit to drive a gate line associated with a row of image-forming components. In other words, each output circuit may be configured to generate a gate signal based at least in part on a carry signal received from a corresponding shift register. The shift register circuits may be arranged in series and configured to propagate carry signals from one stage to the next in synchronization with one or more clock signals. In this way, each row of the display may be addressed in succession, allowing image data to be written to the appropriate row of pixels through the data lines while the corresponding gate line is active. This row-by-row activation may be repeated cyclically to refresh the display at a desired frame rate.

This is schematically illustrated in FIG. 2, in which the gate driver circuit includes a plurality of shift register circuits, including shift registers 210A and 210B, configured to sequentially generate carry signals. Each shift register is implemented through a corresponding plurality of circuit elements 212A/212B. Example arrangements of circuit elements will be described in more detail below with respect to FIG. 3A. As shown, the shift registers receive at least one clock signal 214, which may regulate the sequential generation of carry signals by the shift registers. In some examples, two or more clock signals may be used. For instance, in one example, the shift registers may receive two clock signals that are inverted relative to one another—e.g., when the first clock signal is high, the second clock signal is low, and vice versa.

Based at least in part on the clock signal, the shift registers output carry signals 216. As shown, the carry signal is received by output circuit 206A, and may cause the output circuit to generate the gate signal. Furthermore, as shown, the carry signal output by shift register 210A is also received by shift register 210B. In this manner, each shift register may be controlled based at least in part on the clock signal and a carry signal received from another shift register. In the example of FIG. 2, only one output carry signal is shown. However, it will be understood that this is simplified and non-limiting. In some examples, each shift register may receive two or more carry signals, generated by two or more corresponding shift registers of the gate driver circuit. For instance, a particular shift register circuit may output a carry signal N. The shift register may be controlled based at least in part on a carry signal (N−1) output by a preceding shift register, a carry signal (N+1) generated by a successive shift register, and/or a carry signal (N+2) generated by a successive shift register, as examples.

In the example of FIG. 2, each shift register is operatively coupled with one corresponding output circuit. However, it will be understood that this is simplified and non-limiting. In other examples, one shift register may be associated with two or more corresponding output circuits. For instance, in one example arrangement, each shift register is associated with three corresponding output circuits. Each output circuit may in some cases receive carry signals from two or more different shift registers.

Furthermore, in some examples, the output circuits may be driven by one or more gate clock signals, in addition to the carry signals output by the shift registers. In other words, a particular output circuit may output its gate signal based at least in part on one or more gate clock signals, and on an output carry signal generated by a corresponding shift register circuit. This is schematically illustrated in FIG. 2, in which the output circuits are additionally controlled based at least in part on a gate clock signal 218. In this simplified and non-limiting example, only one gate clock signal is shown. In other arrangements, two or more gate clock signals may be used. For instance, in one example arrangement, the plurality of output circuits may be controlled by eight different gate clock signals, in addition to the carry signals generated by the shift registers.

Figure 3A:
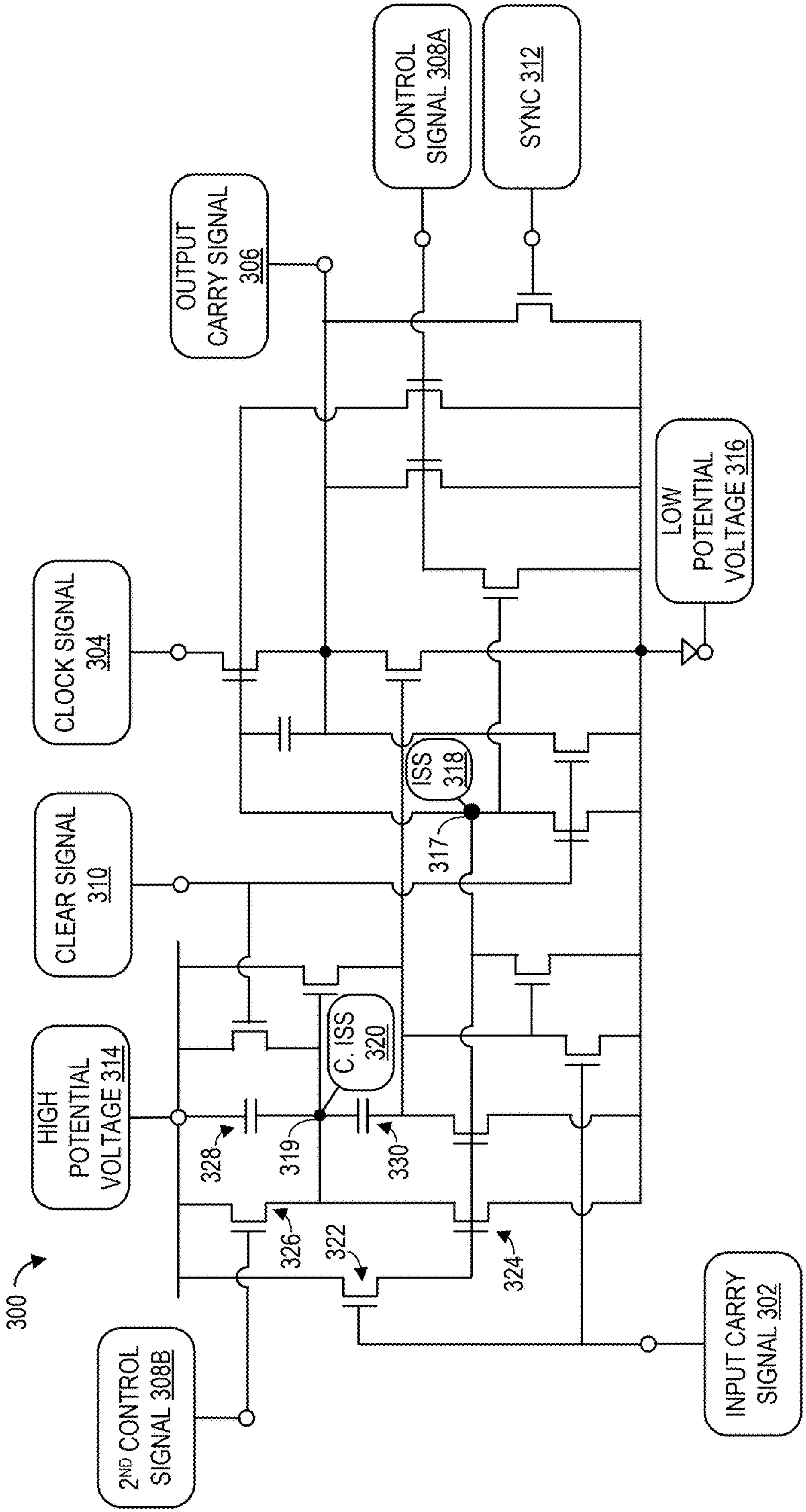
FIG. 3A schematically depicts an example arrangement of circuit elements of a shift register circuit.

As discussed above, each shift register includes a plurality of circuit elements configured to implement the functionality described herein. One non-limiting example arrangement of circuit elements will now be described with respect to FIG. 3A. Specifically, FIG. 3A schematically depicts an example arrangement of circuit elements 300. As shown, the circuit elements include a plurality of transistors and capacitors, which are affected by the states of various input signals that may be received from other components of the gate driver circuit and/or the larger display device. These include an input carry signal 302 and a clock signal 304, which are received by the circuit elements 300. Based at least in part on these signals, the circuit elements generate and output an output carry signal 306, which may be used to control a corresponding output circuit.

The present disclosure generally describes various components as either having a high voltage level or a low voltage level. As used herein, a high voltage level refers to a voltage that is sufficient to activate or turn on a transistor, and represents a logic "high" state within the gate driver circuit. Signals are generally referred to as "active" or "high" when they are at the high voltage level. A low voltage level refers to a voltage that is insufficient to activate or turn on a transistor, and that represents a logic "low" state. The specific values of the high and low voltage levels may vary depending on the characteristics of the circuit components and the display technology. In some implementations, the high voltage level may correspond to a positive driving voltage (e.g., VDD), and the low voltage level may correspond to ground or a negative voltage (e.g., VSS or VGL).

As discussed above, the input carry signal may be generated by another shift register. For instance, if output carry signal 306 is referred to as carry signal N, then input carry signal 302 may be carry signal (N−1) generated by a preceding shift register in the gate driver circuit. In some cases, the circuit elements may receive additional carry signals from one or more additional shift registers. For instance, in FIG. 3A, circuit elements 300 additionally receive a first control signal 308A and a second control signal 308B. In some examples, these may also be implemented as carry signals. For instance, control signal 308A may be an input carry signal (N+1) generated by a subsequent shift register, while control signal 308B is an input carry signal (N+2) generated by another subsequent shift register. In other implementations, the control signals may take another suitable form besides carry signals, and may be generated by any suitable signal generation components of the display device.

In FIG. 3A, the plurality of circuit elements additionally receives a clear signal 310. In some examples, each shift register of the gate driver circuit may receive the clear signal at the same or different times. In some cases, the plurality of circuit elements may be configured to initialize to a predefined state based at least in part on the clear signal. For instance, the output carry signal and an internal state signal may each be initialized to a low voltage level. In some examples, the clear signal may be applied globally across all shift register circuits, while in other implementations it may be selectively applied to individual stages or groups of stages based at least in part on panel driving conditions.

Additionally, in FIG. 3A, the plurality of circuit elements receive a sync signal 312. This may be implemented as a synchronization pulse used to initiate or coordinate the operation of one or more shift register stages. In some examples, the sync signal may correspond to a gate start pulse that activates the first shift register stage in a sequence, enabling the propagation of carry signals to subsequent stages in response to clock signals. The sync signal may be used to align the timing of the gate driver circuit with other system-level timing signals. In certain configurations, the sync signal may be periodically applied to reinitialize the scanning sequence or to control timing boundaries between frame updates. The use of a dedicated sync signal may beneficially allow for more precise control over the timing behavior of the shift register circuits.

In FIG. 3A, the plurality of circuit elements are operatively coupled with a high potential voltage supply 314 and a low potential voltage supply 316. These voltage supplies may be used to drive the various transistors and other components within each shift register circuit. The high potential voltage supply 314 may provide a positive driving voltage (e.g., VDD), while the low potential voltage supply 316 may provide a negative or ground-referenced voltage (e.g., VSS or VGL), depending on the specific requirements of the display technology. The circuit elements may be configured such that different subsets are selectively activated or deactivated using these voltage levels, allowing for the controlled generation and discharge of internal signals. The arrangement of these supply connections supports the reliable generation of timing and control signals throughout the gate driver circuit.

The arrangement of circuit elements collectively are configured to generate an internal state signal at an indicator node based at least in part on the input carry signal and the clock signal. The output carry signal is generated based at least in part on the internal state signal. For instance, the output carry signal may be generated based at least in part on the clock signal being active while the internal state signal is active, as will be described in more detail below. In FIG. 3A, the circuit elements include an indicator node 317, at which an internal state signal 318 is generated based at least in part on the input carry signal and the clock signal. As used herein, an "indicator node" refers to a dynamically driven node within a shift register that temporarily stores a voltage level representing the logic state of that shift register stage. The voltage level at the indicator node (e.g., the state of the internal state signal) may be used to determine whether the stage is active and to control the generation of one or more output signals, such as a carry signal. In some examples, the indicator node may be coupled to one or more transistors that are configured to propagate the logic state to subsequent stages or to control the activation of output circuitry. The voltage at the indicator node may be maintained for a defined period (e.g., using one or more capacitors) and may be selectively discharged to transition the stage to an inactive state.

In some examples, the indicator node is paired with a second, complementary indicator node. In the example of FIG. 3A, the plurality of circuit elements additionally includes a complementary indicator node 319, at which a complementary internal state signal 320 may be generated. Generally, the indicator node and complementary indicator node are configured such that their respective voltage levels represent opposing logic states. For instance, when the internal state signal at the indicator node is at a high voltage level, the complementary internal state signal at the complementary indicator node may be at a low voltage level, and vice versa. In other words, in some cases, the indicator node may be at a high voltage level, and the complementary indicator node may be at a low voltage level, when the output carry signal is active.

This complementary relationship can be used to improve signal integrity, enforce mutually exclusive control conditions, and support more efficient charge and discharge operations. By coordinating transitions between these nodes, the circuit may achieve more reliable timing behavior and prevent undesired conduction paths that could otherwise lead to excess power consumption. It will be understood that the indicator node and complementary indicator node need not always have opposing logic states. In other words, some circuit conditions may arise in which the indicator node and complementary indicator node have the same state—e.g., both are low, or both are high.

Figure 3B:
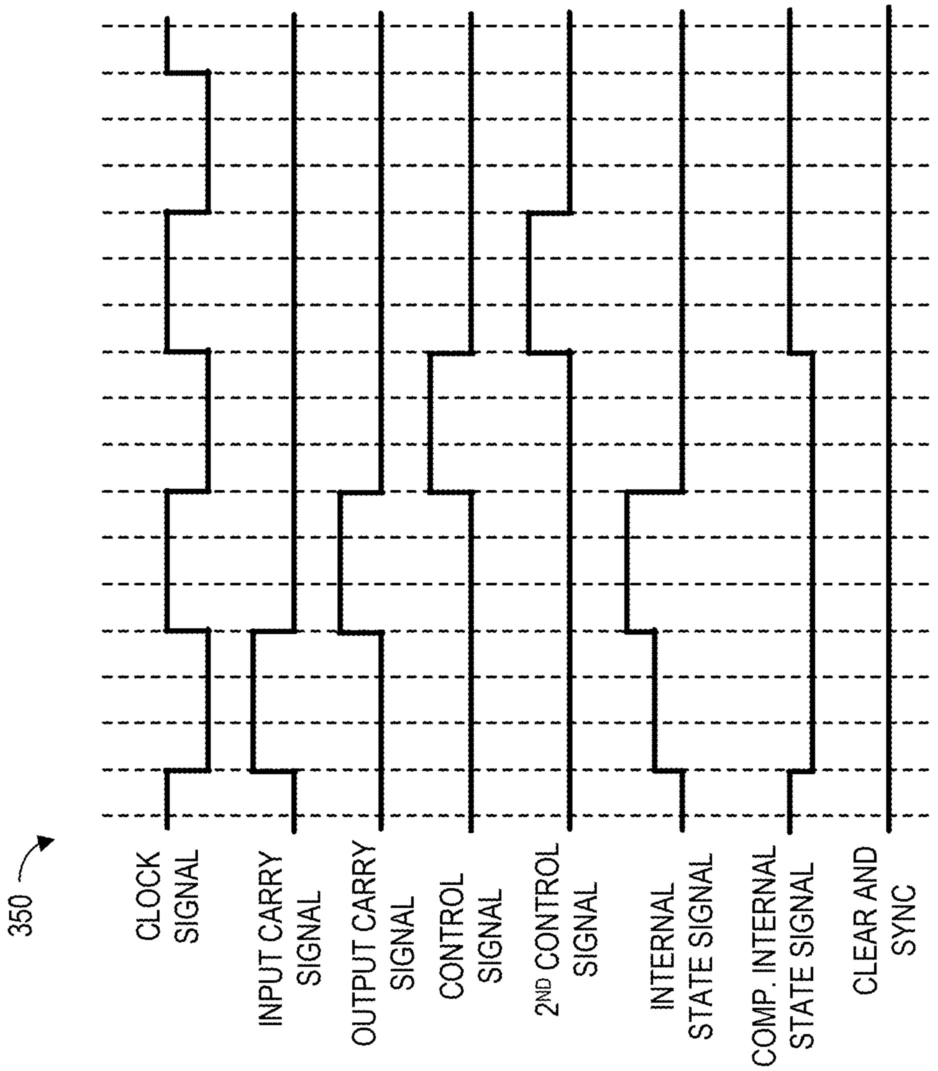
FIG. 3B shows a timing diagram indicating the states of different signals associated with the circuit elements of FIG. 3A.

In FIG. 3A, various signals are either supplied to, or output from, the plurality of circuit elements. The states of these different signals may change over time, based at least in part on the states of other signals supplied to the shift register, and the configuration of the circuit elements shown in FIG. 3A. This is illustrated in FIG. 3B, depicting a timing diagram 350 that shows changes in the various signals over time. These signal transitions will be described in more detail below with respect to FIGS. 4A-10B.

As discussed above, in some shift register designs, certain circuit conditions can lead to a transient conductive path between the high potential voltage supply and the low potential voltage supply, which can contribute to excessive and unnecessary power consumption. As such, in the example configuration depicted in FIG. 3A, the plurality of circuit elements are arranged so as to prevent a through current path between the high potential voltage supply and the low potential voltage supply. This is done by disabling at least one transistor when the internal state signal is active. As a result, power consumption is reduced as compared to other shift register designs, beneficially improving the power efficiency of the overall display device.

The configuration of FIG. 3A will now be described in more detail, to better illustrate how the circuit elements collectively prevent the through current path between the high and low voltage supplies. As shown, the plurality of circuit elements include a first transistor 322, which is coupled to the high potential voltage supply through its source, and coupled to the indicator node through its drain. The first transistor receives the input carry signal at its gate. In this manner, when the input carry signal is active, the first transistor connects the indicator node to the high potential voltage supply, and thus the indicator node is pulled up to the high voltage level when the input carry signal is active.

Additionally, the plurality of circuit elements include a second transistor 324 between the first transistor and the indicator node. The gate of the second transistor is coupled to the drain of the first transistor. The source of the second transistor is coupled to the complementary indicator node, and the drain of the second transistor is coupled to the low potential voltage supply. As a result, when the input carry signal is active, the gate of the second transistor is coupled to the high potential voltage supply. This in turn connects the complementary indicator node to the low potential voltage supply. In other words, the complementary indicator node is pulled down to the low voltage level when the input carry signal is active. This in turn causes the complementary indicator node to have the opposite logical state as compared to the indicator node, as discussed above.

Additionally, the plurality of circuit elements includes a third transistor 326, between the second transistor and the high potential voltage supply. The source of the third transistor is coupled to the high potential voltage supply, the drain of the third transistor is coupled to the complementary indicator node, and the second control signal is received at the gate of the third transistor. In other words, the third transistor may be enabled or disabled based at least in part on the state of the second control signal, and the complementary indicator node is pulled up to the high voltage level when the second control signal is active. As discussed above, in some examples, the second control signal may take the form of a carry signal (e.g., an (N+2) carry signal) generated by another shift register circuit.

The third transistor may beneficially be used to prevent the through current path between the high potential voltage supply and the low potential voltage supply. For instance, as discussed above, the input carry signal activates the first transistor 322, which in turn connects the gate of the second transistor to the high potential voltage supply. In a hypothetical configuration where third transistor 326 is not included, a through current path would form between the high potential voltage supply and the low potential voltage supply when the input carry signal is active. This would contribute to unnecessary power consumption, as discussed above. Accordingly, in the configuration shown in FIG. 3A, the second control signal can be used to control the state of the third transistor. In other words, the input carry signal may be inactive when the control signal is active, and the control signal may be inactive when the input carry signal is active. By disabling the third transistor in at least some scenarios where the input carry signal is active, the through current path is prevented, and the unnecessary power consumption is therefore also prevented.

Additionally, in this example, the plurality of circuit elements includes a capacitor 328 between the high potential voltage supply and the complementary indicator node. A second capacitor 330 is also included. These capacitors may serve to store and transfer charge during operation of the shift register circuit. For instance, capacitors 328 and/or 330 may assist in establishing or maintaining the voltage level at the complementary indicator node, particularly during transitions driven by control or clock signals. This can support the reliable generation of the complementary internal state signal and help ensure appropriate timing relationships with respect to the indicator node.

Figure 4A:
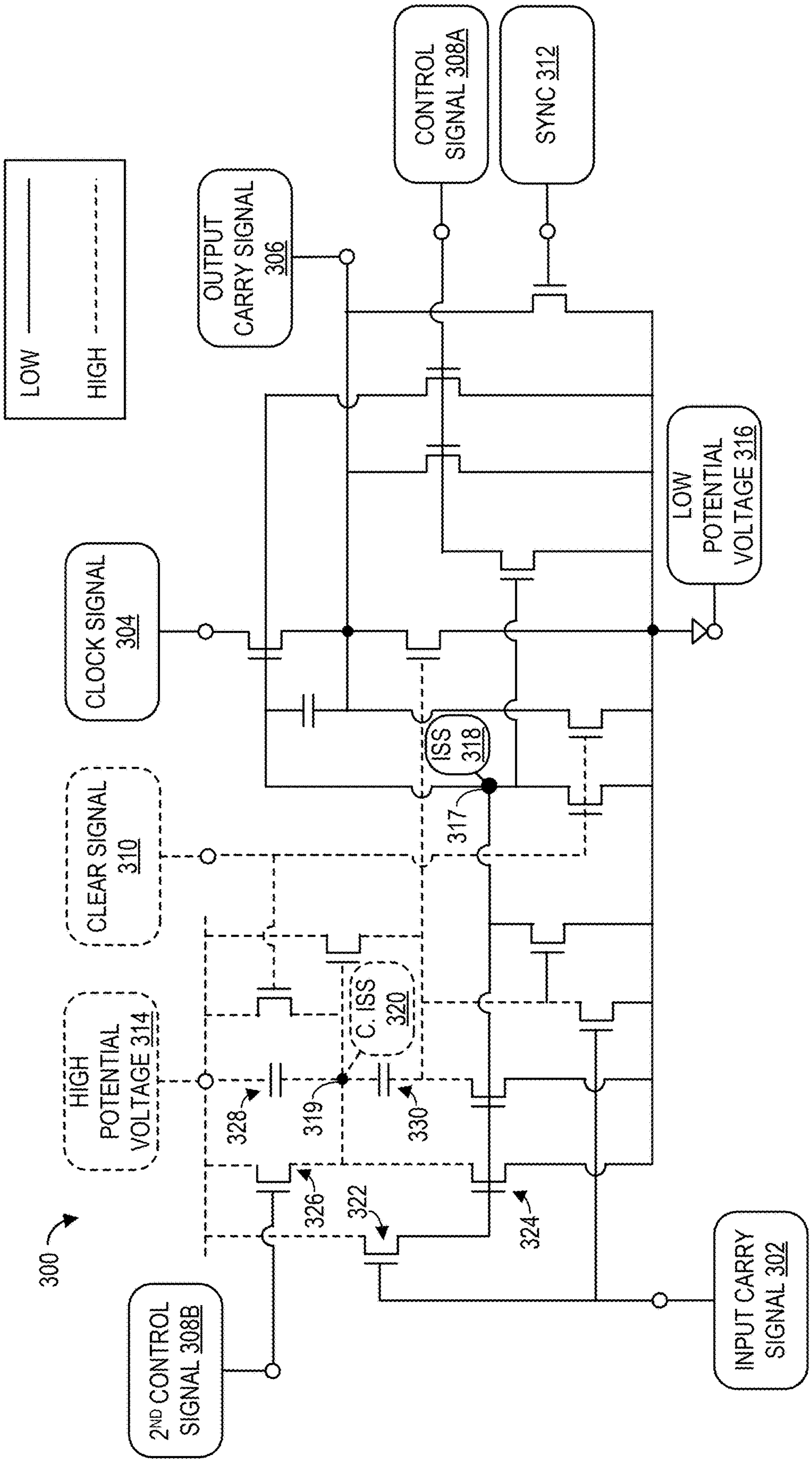
FIG. 4A schematically depicts the relative voltage states of different circuit elements of FIG. 3A under an example operating condition.

FIGS. 4A-10B will now be used to illustrate the behavior of this circuit arrangement under different operating conditions. Specifically, FIG. 4A again schematically depicts the arrangement of circuit elements 300, while FIG. 4B depicts a timing diagram 400 that shows the relative states of the various signals input to or output by the circuit elements over time. In FIG. 4A, as well as FIGS. 5A, 6A, 7A, etc., dashed lines indicate high voltage levels (e.g., logical ones), while solid lines indicate low voltage levels (e.g., logical zeroes).

Figure 4B:
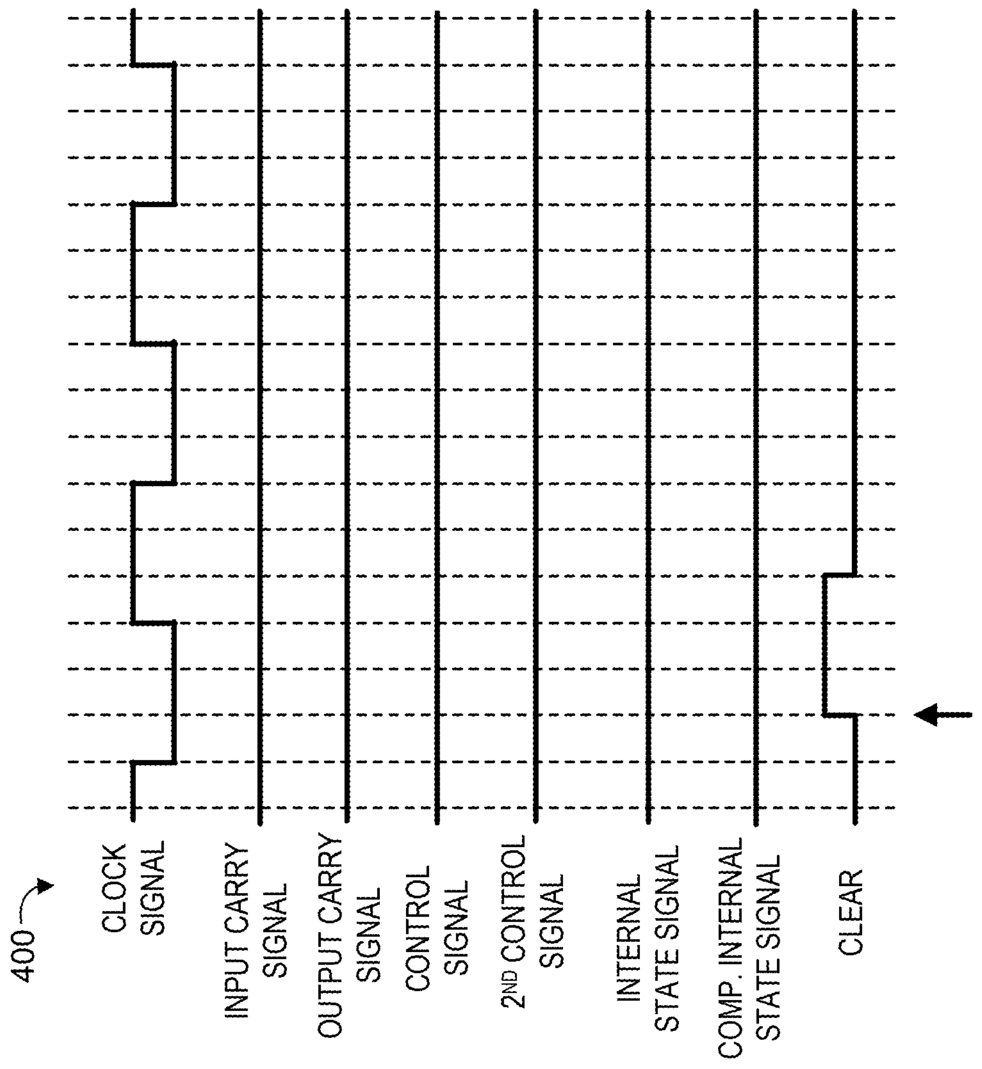
FIG. 4B shows a timing diagram indicating the states of different signals in the example operating condition of FIG. 4A.

More particularly, in FIG. 4A, the plurality of circuit elements are receiving clear signal 310. As a result, the plurality of circuit elements is initialized to a predefined state. This includes initializing the indicator node 317 and the output carry signal 306 to the low voltage level, as is shown in FIGS. 4A and 4B. As discussed above, this can beneficially be used to control the state of the shift register in various operational contexts, such as during power-up sequences, frame transitions, or error recovery procedures. The use of the clear signal may help ensure that each shift register stage begins operation from a known state, thereby improving timing consistency and reducing the likelihood of unintended gate line activation.

Figure 5A:
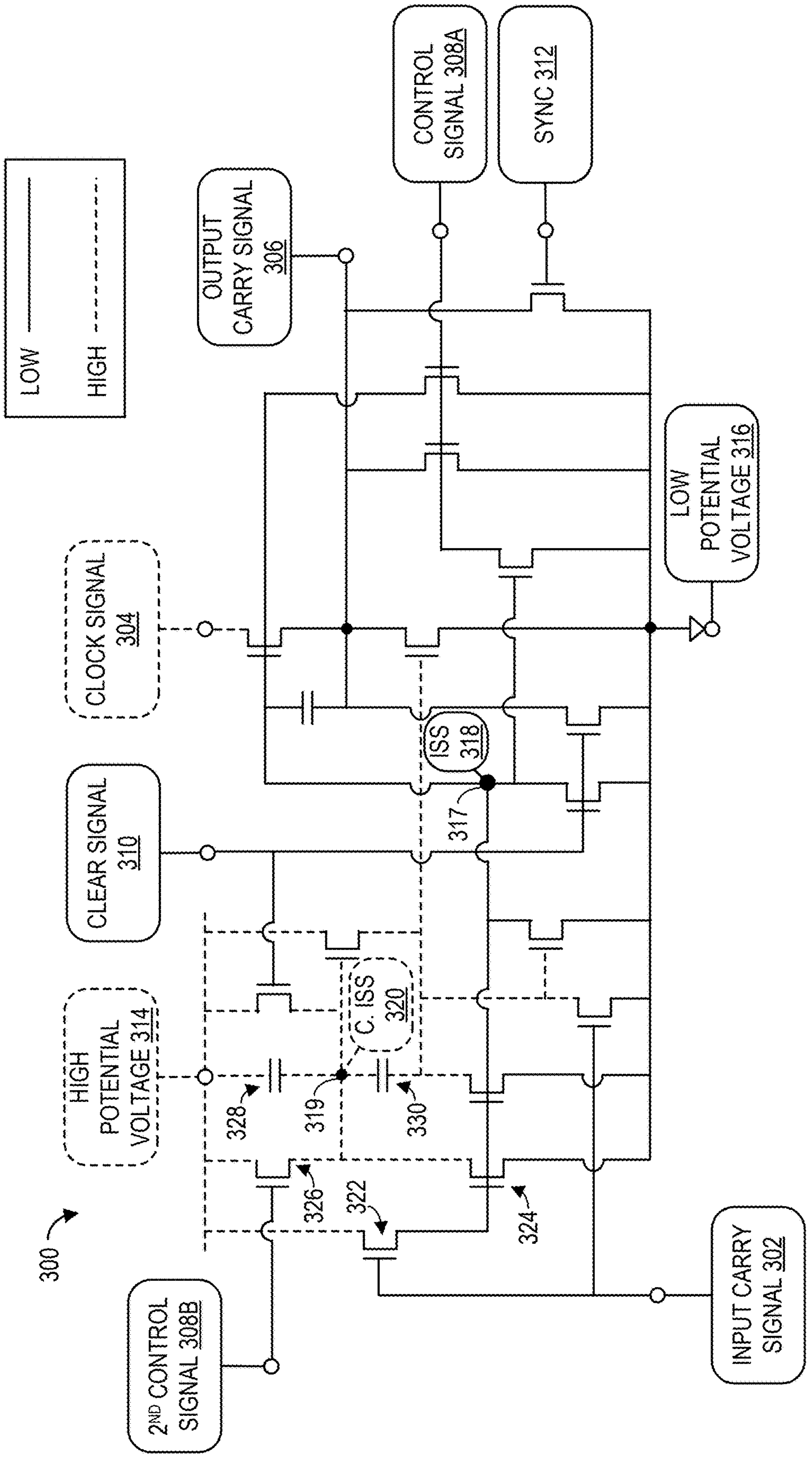
FIG. 5A schematically depicts the relative voltage states of different circuit elements of FIG. 3A under another example operating condition.
Figure 5B:
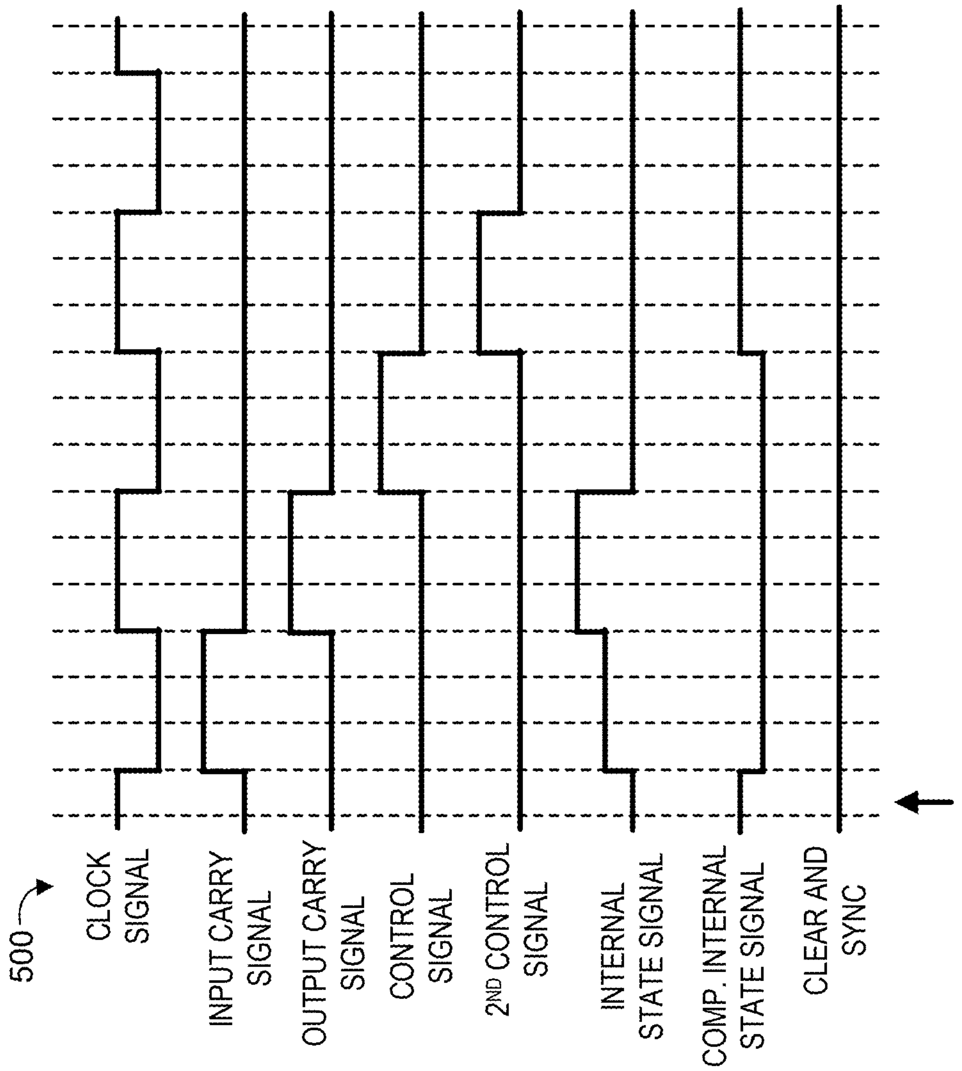
FIG. 5B shows a timing diagram indicating the states of different signals in the example operating condition of FIG. 5A.

FIG. 5A again schematically depicts the arrangement of circuit elements 300, while FIG. 5B depicts a timing diagram 500 that shows the relative states of the various signals input to or output by the circuit elements over time. Specifically, FIG. 5A depicts the plurality of circuit elements in a preliminary state after initialization. In this case, the clock signal is active, but the other various input signals (such as the input carry signal) are inactive. As such, the internal state signal and output carry signal are each inactive, while the complementary indicator state signal is active. This voltage configuration reflects a default or standby condition in which the shift register stage is not actively propagating a signal but is prepared to respond to subsequent activation events. This condition may occur immediately following a reset event or prior to receipt of an input carry signal from an upstream stage.

Figure 6A:
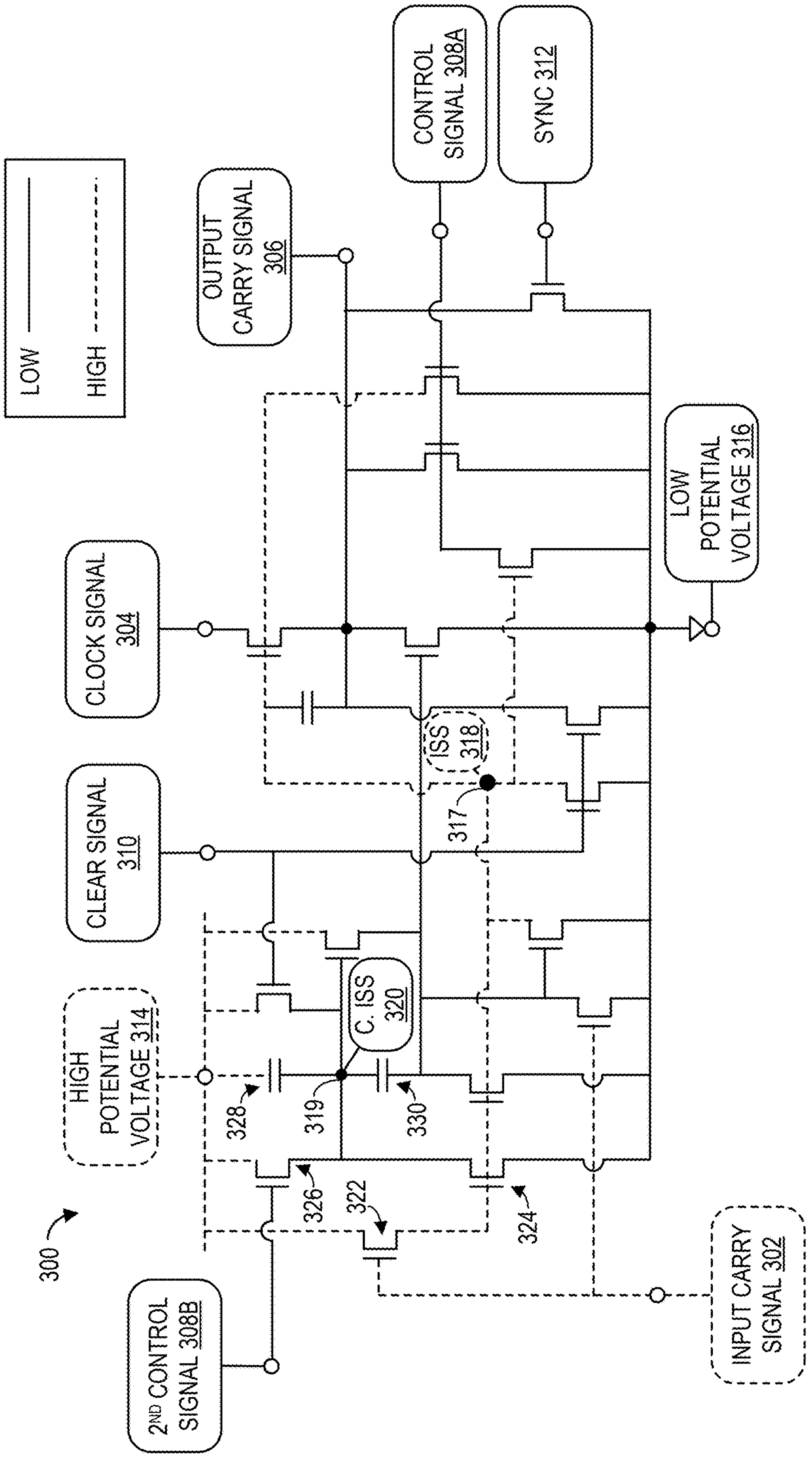
FIG. 6A schematically depicts the relative voltage states of different circuit elements of FIG. 3A under another example operating condition.
Figure 6B:
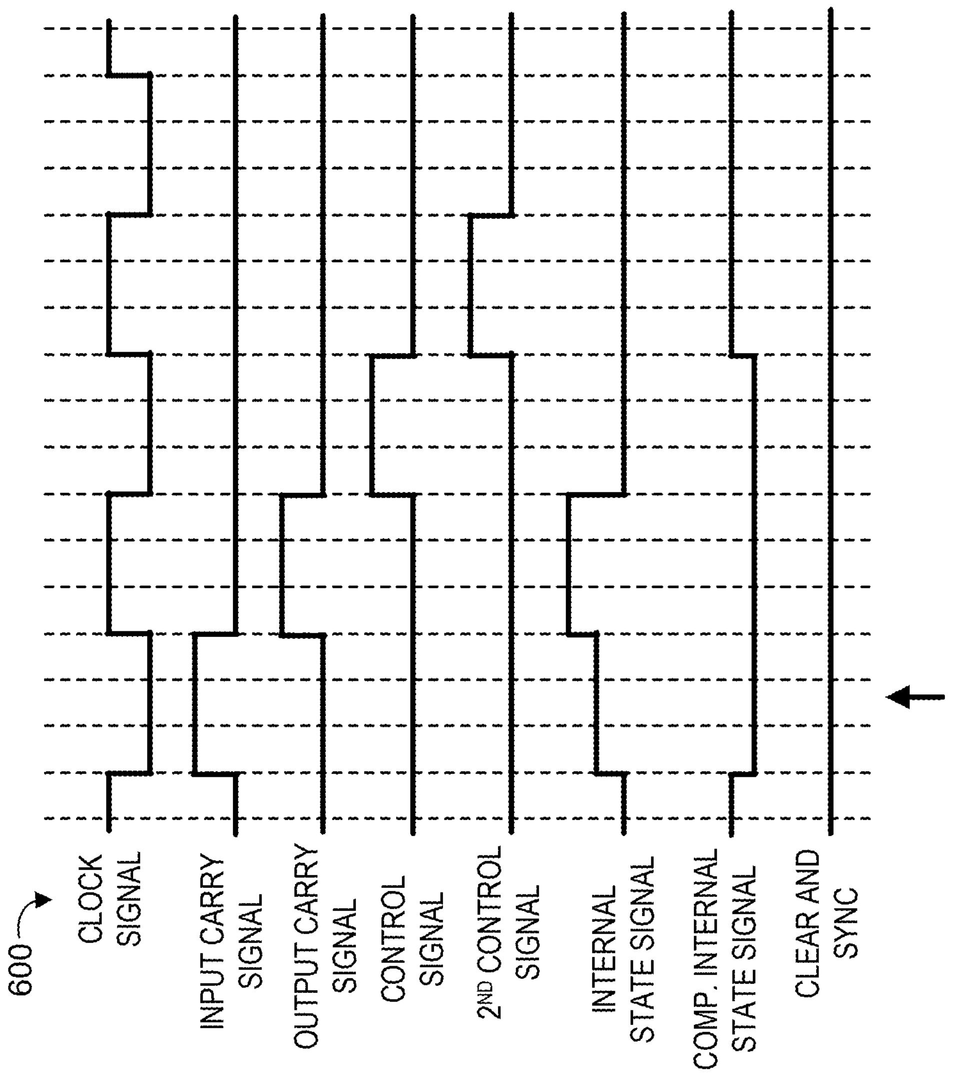
FIG. 6B shows a timing diagram indicating the states of different signals in the example operating condition of FIG. 6A.

FIG. 6A again schematically depicts the arrangement of circuit elements 300, while FIG. 6B depicts a timing diagram 600 that shows the relative states of the various signals input to or output by the circuit elements over time. As shown, the input carry signal is now active, while the clock signal is inactive. The input carry signal activates first transistor 322, thereby connecting the indicator node to the high potential voltage supply. Additionally, as discussed above, second transistor 324 connects the complementary indicator node to the low potential voltage supply. In this manner, the indicator node and complementary indicator node still have opposite logical states.

Figure 7A:
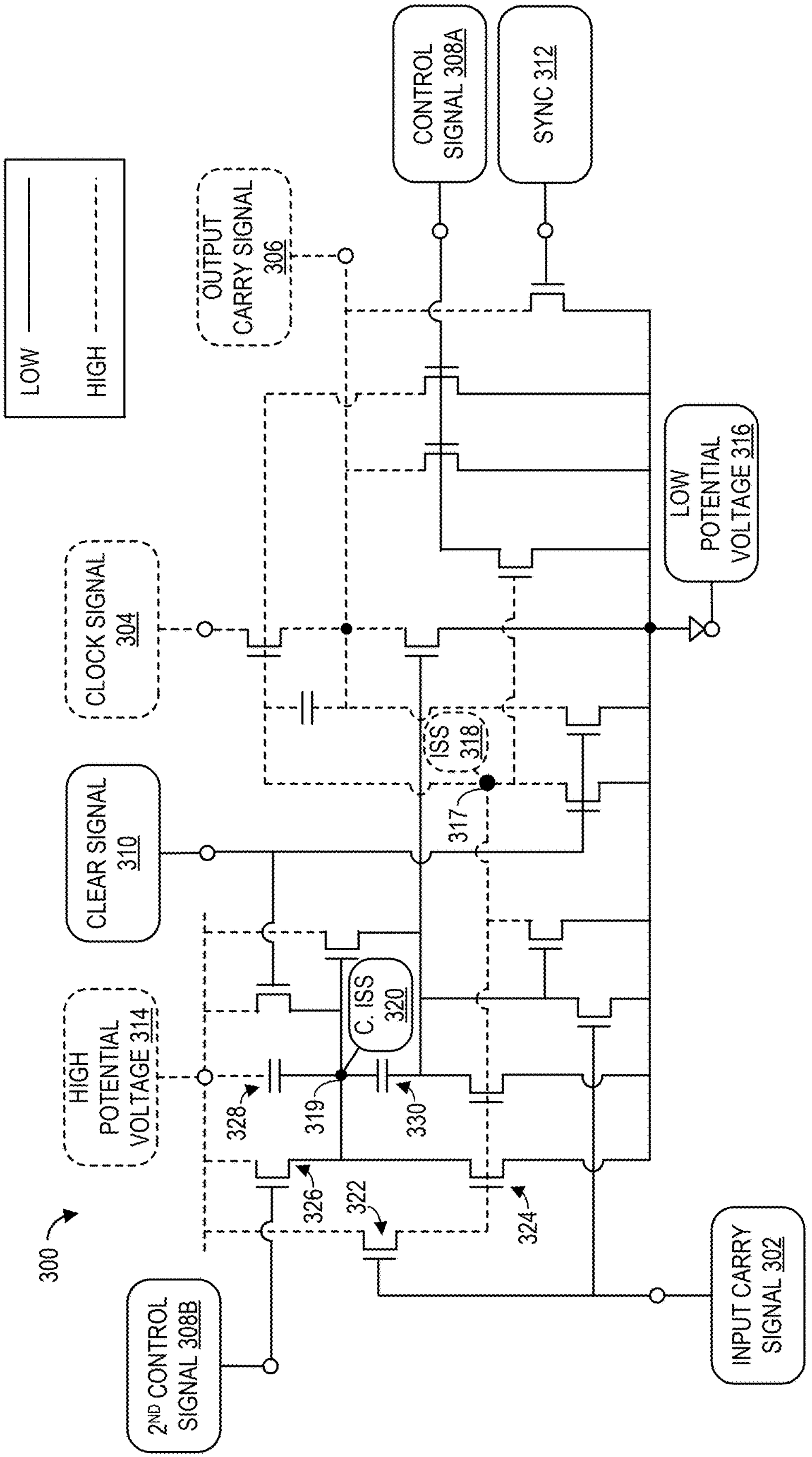
FIG. 7A schematically depicts the relative voltage states of different circuit elements of FIG. 3A under another example operating condition.
Figure 7B:
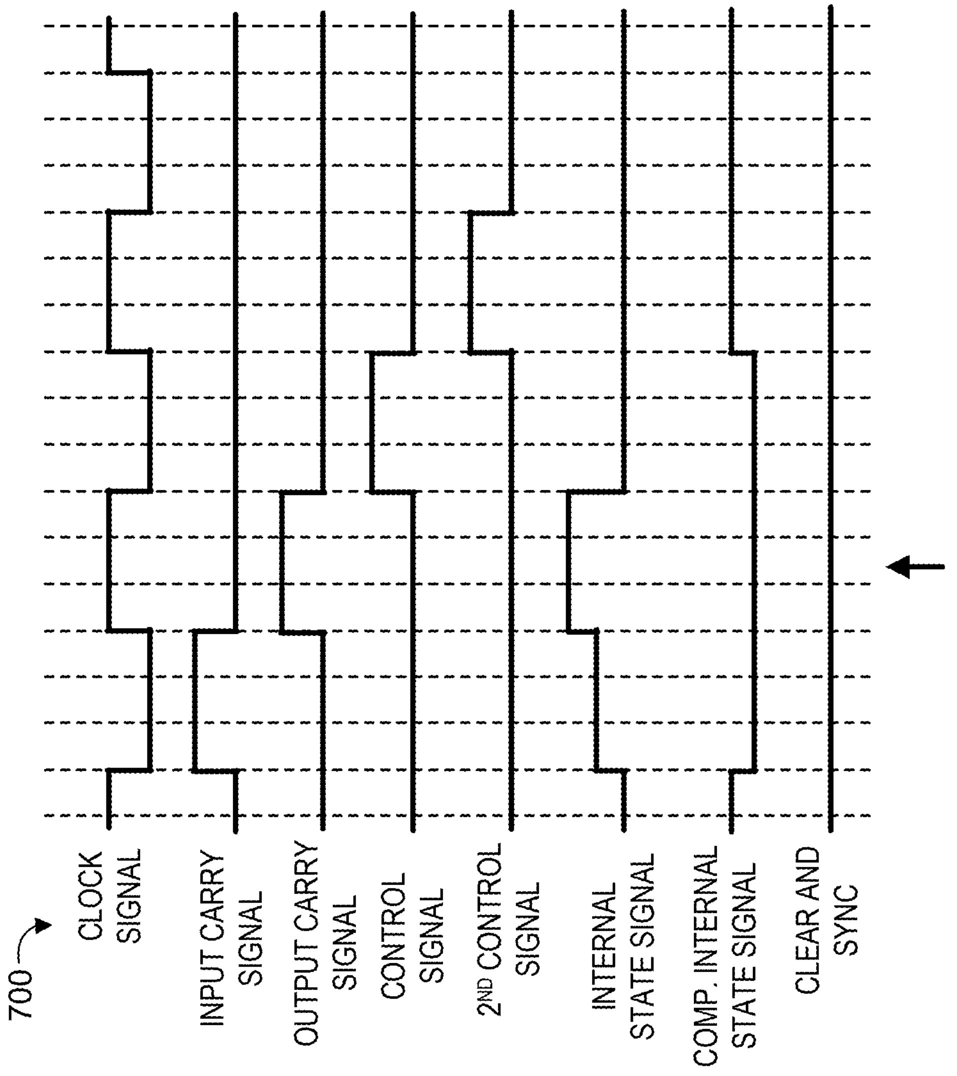
FIG. 7B shows a timing diagram indicating the states of different signals in the example operating condition of FIG. 7A.

FIG. 7A again schematically depicts the arrangement of circuit elements 300, while FIG. 7B depicts a timing diagram 700 that shows the relative states of the various signals input to or output by the circuit elements over time. In this example, the input carry signal is no longer active, having transitioned to a low voltage level. However, the indicator node remains temporarily at a high voltage level, for example due to charge stored by one or more capacitors coupled to the node. At this point, the clock signal is high, which further boosts the voltage at the indicator node to a higher level as illustrated in FIG. 7B. This elevated internal state signal is sufficient to activate the transistors responsible for generating the output carry signal, which transitions to a high voltage level. As discussed above, when the output carry signal is generated, it may trigger a corresponding output circuit, which applies a gate signal to an associated gate line of the display panel. This may result in the activation of a downstream row of image-forming components, such as pixels, thereby enabling them to receive image data during the active period of the gate signal.

Figure 8A:
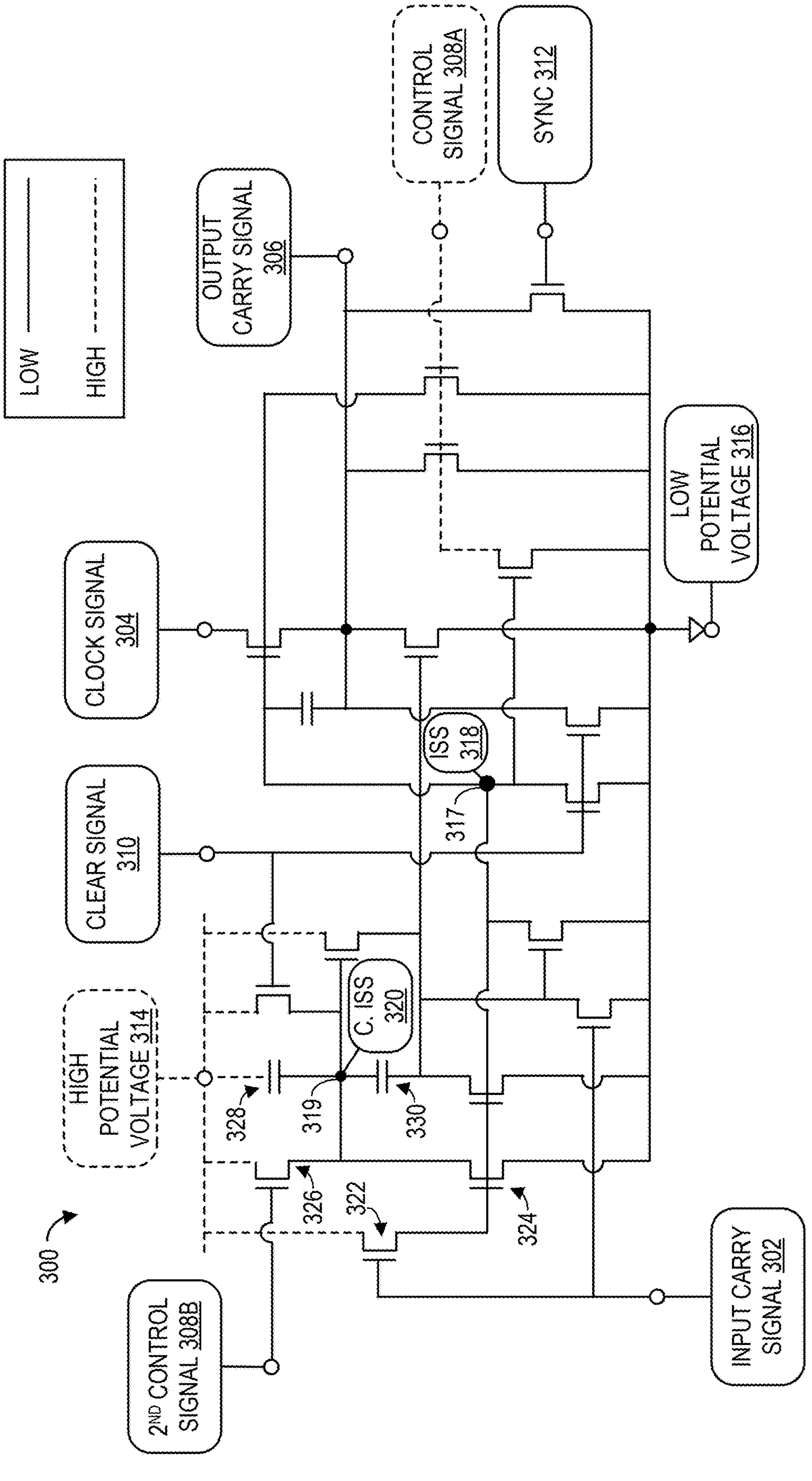
FIG. 8A schematically depicts the relative voltage states of different circuit elements of FIG. 3A under another example operating condition.
Figure 8B:
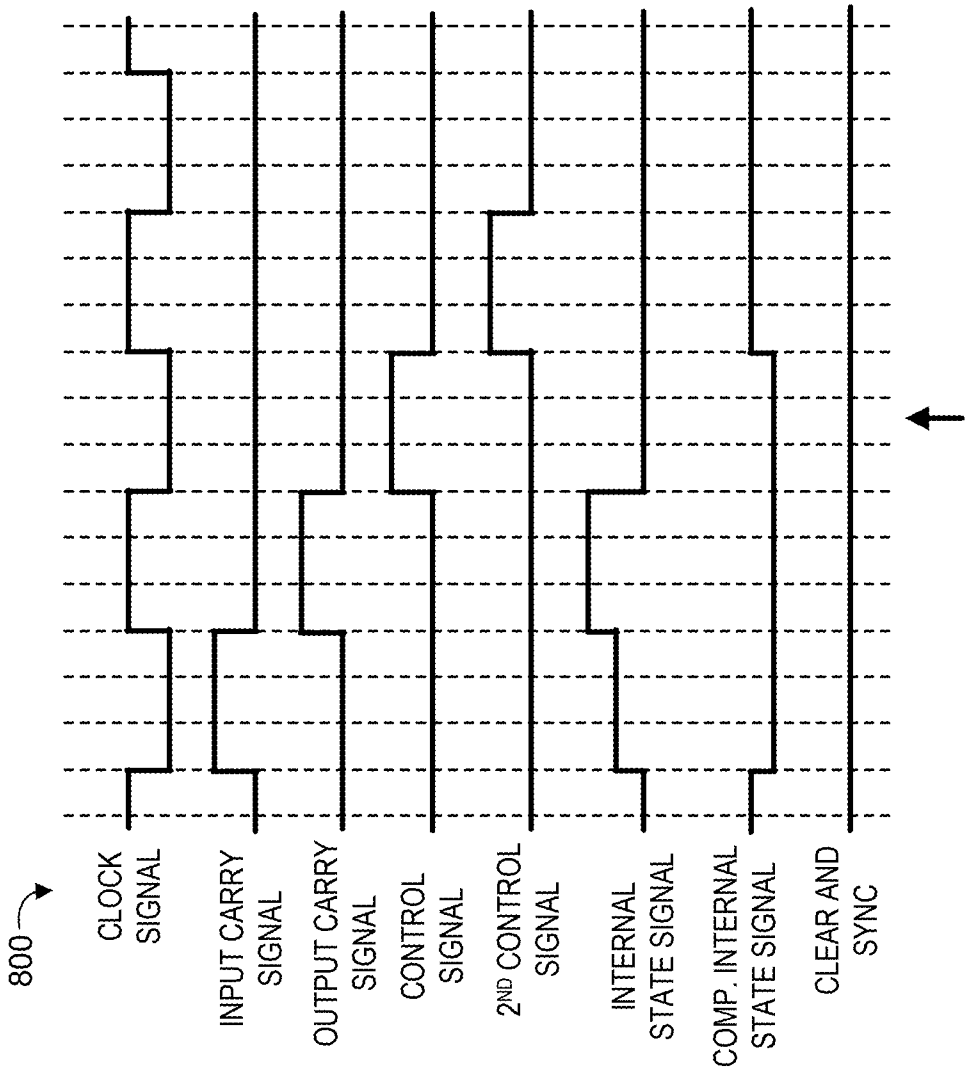
FIG. 8B shows a timing diagram indicating the states of different signals in the example operating condition of FIG. 8A.

FIG. 8A again schematically depicts the arrangement of circuit elements 300, while FIG. 8B depicts a timing diagram 800 that shows the relative states of the various signals input to or output by the circuit elements over time. In FIG. 8A, the clock signal and input carry signal are each inactive, and the first control signal 308A is active. As discussed above, the first control signal may take the form of another input carry signal, such as an (N+1) carry signal generated by the next shift register stage in the sequence. This signal combination causes the indicator node to be discharged to the low voltage level, and the output carry signal is no longer output. In this state, the circuit elements respond to the downstream carry signal by disabling transistors responsible for maintaining the internal state signal at a high level, thereby deactivating the current stage. This transition helps enforce proper sequencing by ensuring that only one shift register stage remains active at a given time, and prevents unintended overlap between output carry signals.

Figure 9A:
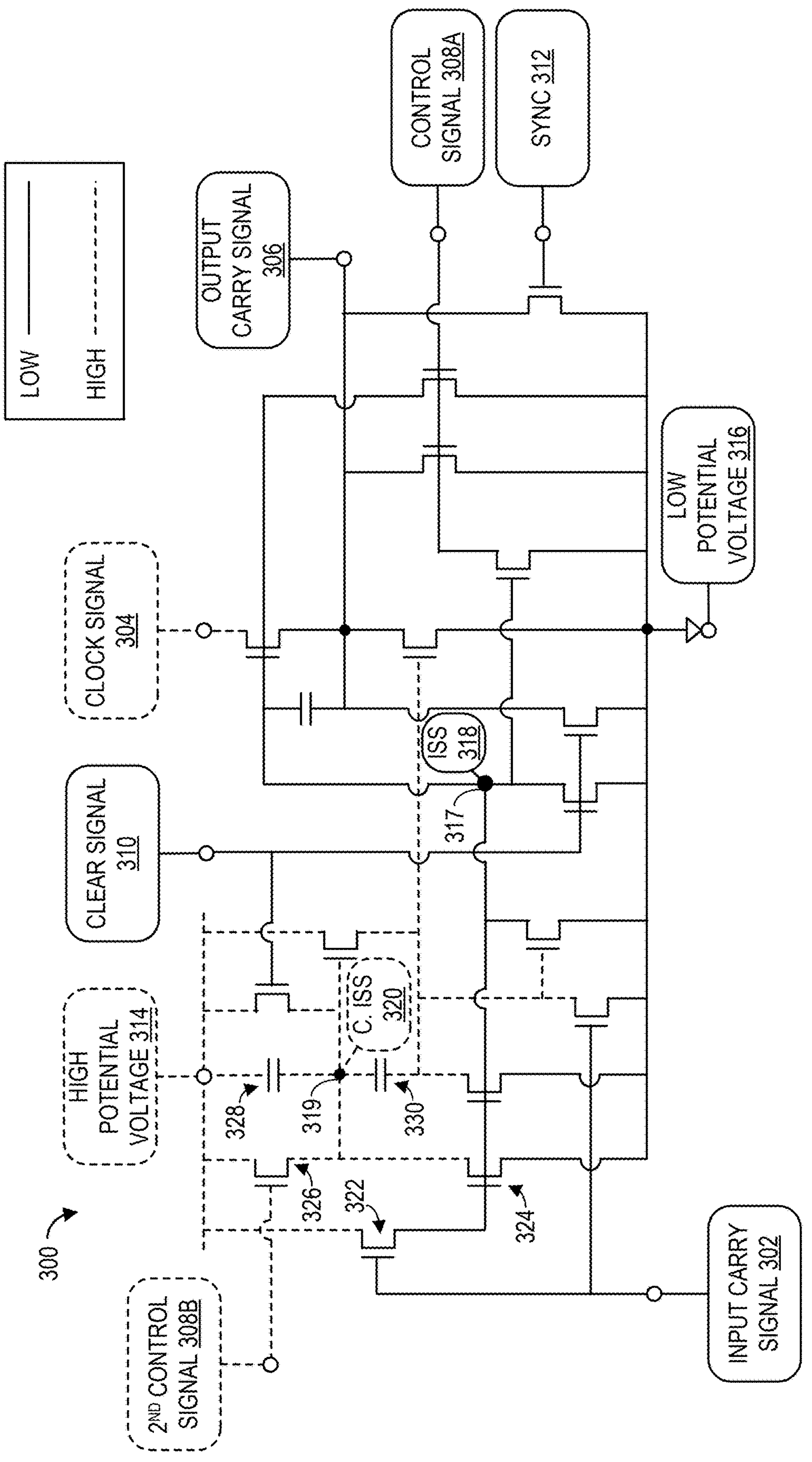
FIG. 9A schematically depicts the relative voltage states of different circuit elements of FIG. 3A under another example operating condition.
Figure 9B:
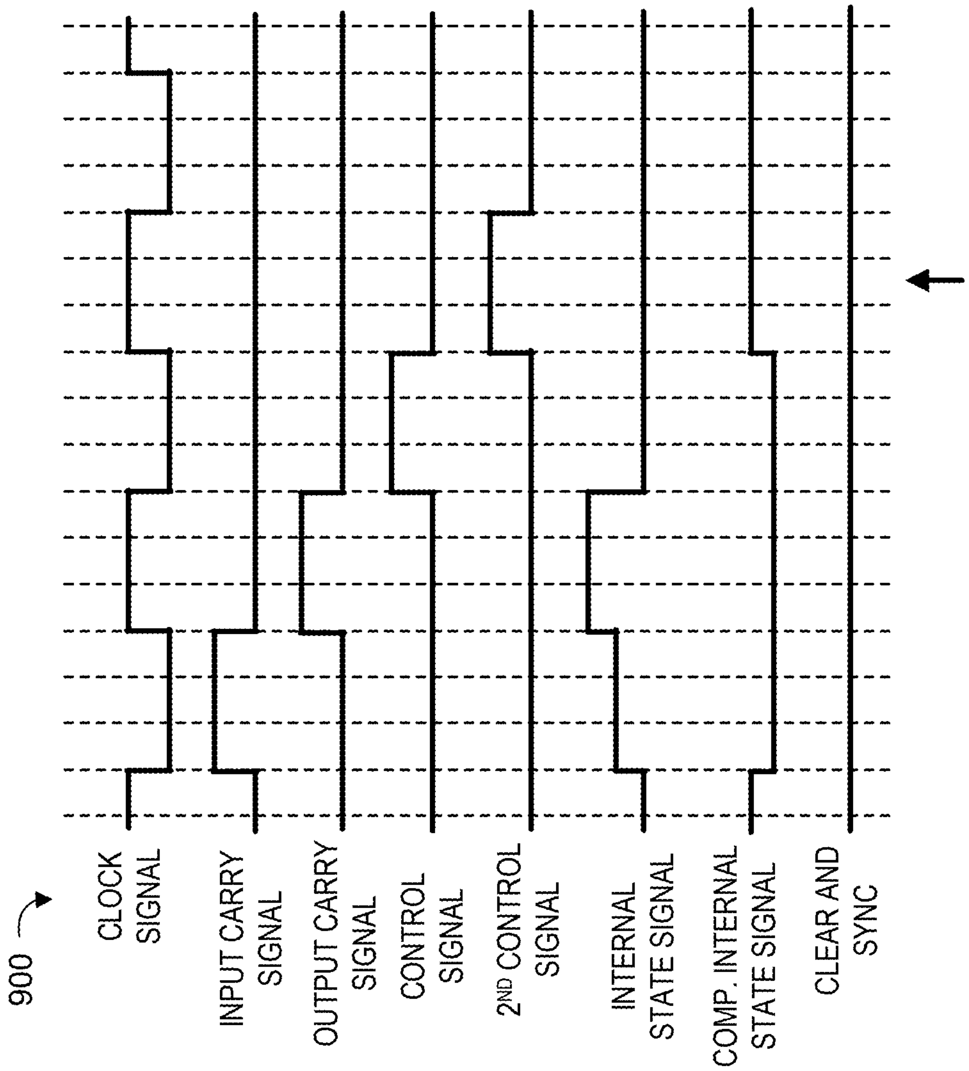
FIG. 9B shows a timing diagram indicating the states of different signals in the example operating condition of FIG. 9A.

FIG. 9A again schematically depicts the arrangement of circuit elements 300, while FIG. 9B depicts a timing diagram 900 that shows the relative states of the various signals input to or output by the circuit elements over time. In FIG. 9A, the second control signal 308B is now active. As discussed above, the second control signal may take the form of another input carry signal, such as an (N+2) carry signal generated by another shift register in the gate driver circuit. This actives the third transistor 326, thereby connecting the complementary indicator node to the high potential voltage supply. As such, the complementary indicator node again has the opposite logical state from indicator node 317. This complementary relationship ensures that the indicator node is pulled down to a low voltage level while the complementary indicator node is pulled up to a high voltage level, maintaining consistent internal logic across the shift register stage. This arrangement may assist in deactivating the current stage, suppressing the generation of an output carry signal, and preparing the circuit for subsequent transitions in the scanning sequence. Furthermore, as discussed above, deactivation of the third transistor by discontinuing the second control signal (e.g., in cases where the input carry signal is active) can prevent a through current path between the high potential voltage supply and the low potential voltage supply.

Figure 10A:
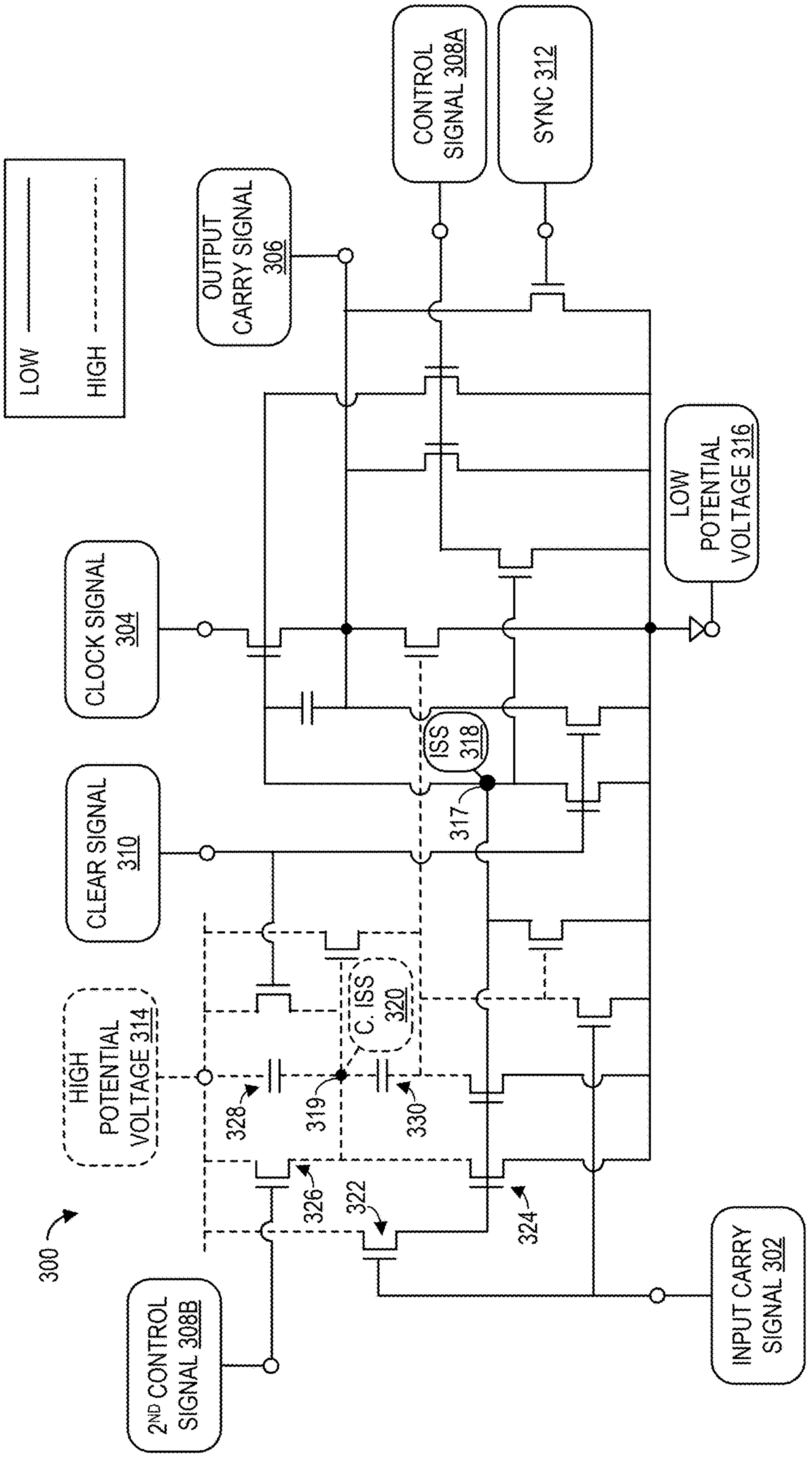
FIG. 10A schematically depicts the relative voltage states of different circuit elements of FIG. 3A under another example operating condition.
Figure 10B:
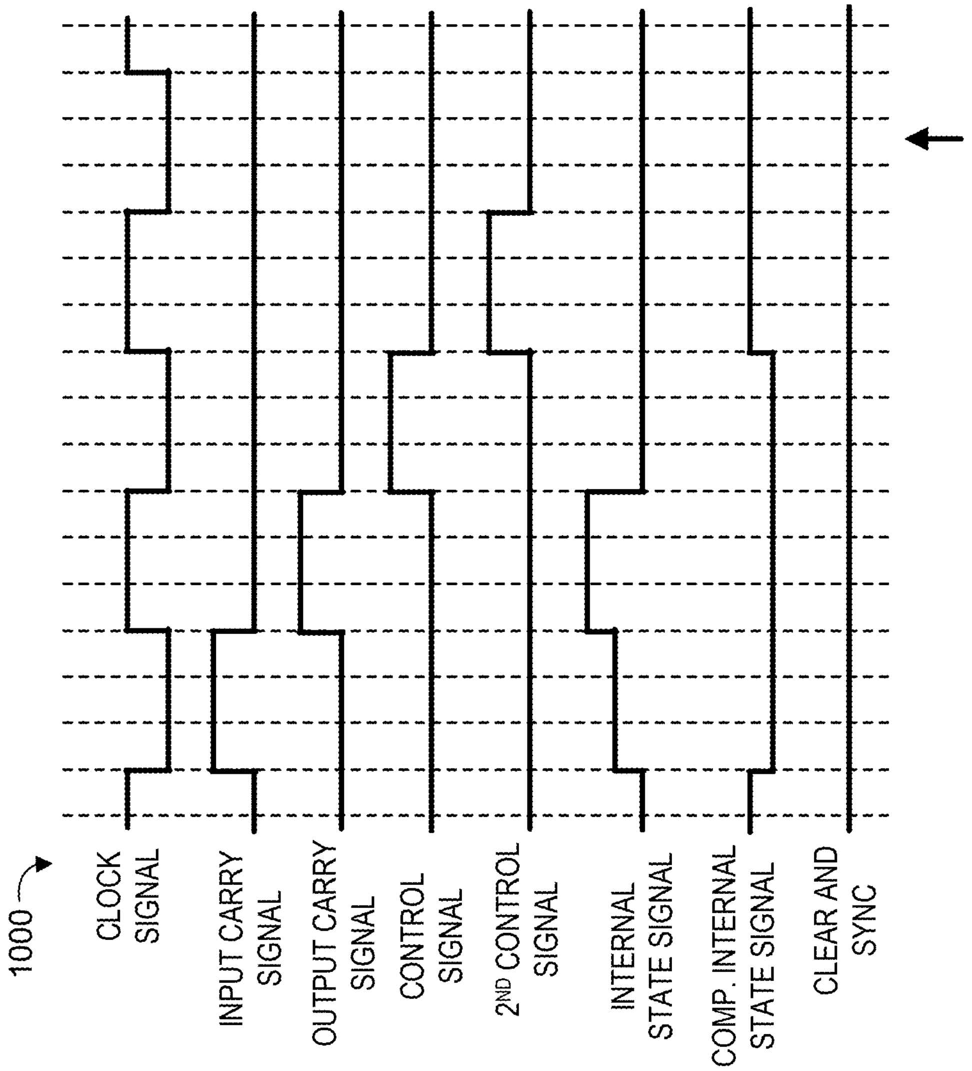
FIG. 10B shows a timing diagram indicating the states of different signals in the example operating condition of FIG. 10A.

FIG. 10A again schematically depicts the arrangement of circuit elements 300, while FIG. 10B depicts a timing diagram 1000 that shows the relative states of the various signals input to or output by the circuit elements over time. In FIG. 10A, each of the various input signals are inactive (with the exception of the high potential voltage supply). As a result, the indicator node is still at the low voltage level, the complementary indicator node is still at the high voltage level, and the output carry signal is not generated. This reflects an intermediary state of the shift register stage, in which no active transition is occurring and the internal state of the stage remains stable. By maintaining these voltage levels in the absence of active input signals, the circuit avoids unnecessary transitions or current flow, thereby conserving power and preserving timing integrity across the gate driver circuit. Such a state may occur between scan cycles, during initialization, or while awaiting the next propagation event from an upstream shift register stage.

The methods and processes described herein may be tied to a computing system of one or more computing devices. In particular, such methods and processes may be implemented as an executable computer-application program, a network-accessible computing service, an application-programming interface (API), a library, or a combination of the above and/or other compute resources.

Figure 11:
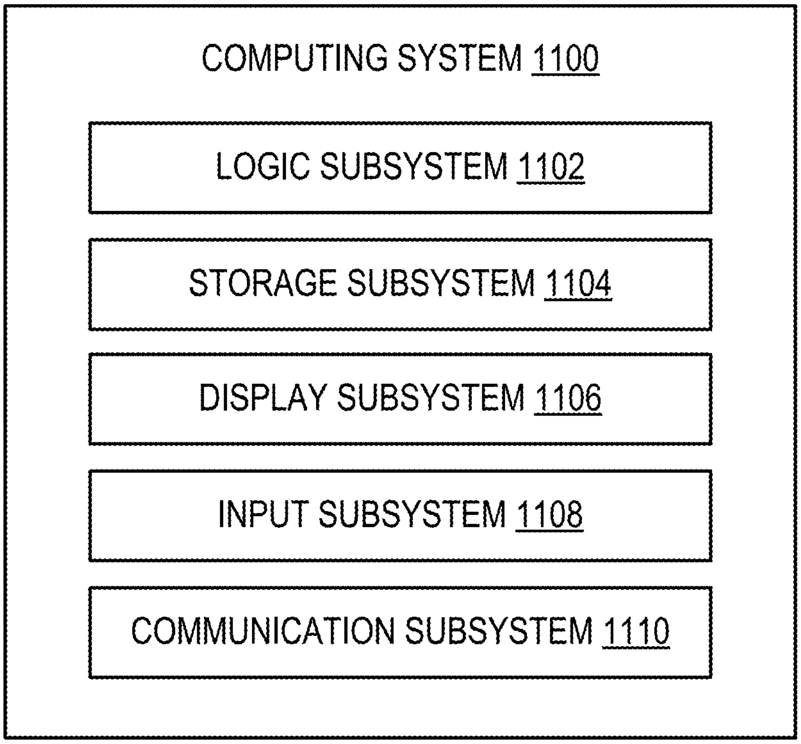
FIG. 11 schematically shows an example computing system.

FIG. 11 schematically shows a simplified representation of a computing system 1100 configured to provide any to all of the compute functionality described herein. Computing system 1100 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 1100 includes a logic subsystem 1102 and a storage subsystem 1104. Computing system 1100 may optionally include a display subsystem 1106, input subsystem 1108, communication subsystem 1110, and/or other subsystems not shown in FIG. 11.

Logic subsystem 1102 includes one or more physical devices configured to execute instructions. For example, the logic subsystem may be configured to execute instructions that are part of one or more applications, services, or other logical constructs. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 1104 includes one or more physical devices configured to temporarily and/or permanently hold computer information such as data and instructions executable by the logic subsystem. When the storage subsystem includes two or more devices, the devices may be collocated and/or remotely located. Storage subsystem 1104 may include volatile, nonvolatile, dynamic, static, read/write, read-only, random-access, sequential-access, location-addressable, file-addressable, and/or content-addressable devices. Storage subsystem 1104 may include removable and/or built-in devices. When the logic subsystem executes instructions, the state of storage subsystem 1104 may be transformed—e.g., to hold different data.

Aspects of logic subsystem 1102 and storage subsystem 1104 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

When included, display subsystem 1106 may be used to present a visual representation of data held by storage subsystem 1104. This visual representation may take the form of a graphical user interface (GUI). Display subsystem 1106 may include one or more display devices utilizing virtually any type of technology. In some implementations, display subsystem may include one or more virtual-, augmented-, or mixed reality displays.

When included, input subsystem 1108 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 1110 may be configured to communicatively couple computing system 1100 with one or more other computing devices. Communication subsystem 1110 may include wired and/or wireless communication devices compatible with one or more different communication protocols. The communication subsystem may be configured for communication via personal-, local- and/or wide-area networks.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

In an example, a gate driver circuit for a display device comprises: a plurality of shift register circuits configured to sequentially generate carry signals; and a plurality of output circuits respectively associated with the plurality of shift register circuits, each output circuit configured to generate a gate signal based at least in part on the carry signals; wherein each shift register circuit comprises a plurality of circuit elements configured to: receive an input carry signal and a clock signal; generate an internal state signal at an indicator node based at least in part on the input carry signal and the clock signal; generate an output carry signal based at least in part on the internal state signal; and prevent a through current path between a high potential voltage supply and a low potential voltage supply by disabling at least one transistor when the internal state signal is active. In this example or any other example, the plurality of circuit elements include a first transistor coupled to the high potential voltage supply through a source of the first transistor, and coupled to the indicator node through a drain of the first transistor, wherein the input carry signal is received at a gate of the first transistor, and the indicator node is pulled up to the high voltage level when the input carry signal is active. In this example or any other example, the plurality of circuit elements include a second transistor between the first transistor and the indicator node, such that a gate of the second transistor is coupled to the drain of the first transistor, wherein a source of the second transistor is coupled to a complementary indicator node, a drain of the second transistor is coupled to the low potential voltage supply, and the complementary indicator node is pulled down to a low voltage level when the input carry signal is active. In this example or any other example, the indicator node is at a high voltage level and the complementary indicator node is at the low voltage level when the output carry signal is active. In this example or any other example, the plurality of circuit elements include a capacitor between the high potential voltage supply and the complementary indicator node. In this example or any other example, the plurality of circuit elements include a third transistor between the second transistor and the high potential voltage supply, wherein the third transistor is selectively enabled by a control signal, and wherein the at least one transistor disabled to prevent the through current path includes the third transistor. In this example or any other example, a source of the third transistor is coupled to the high potential voltage supply, a drain of the third transistor is coupled to the complementary indicator node, the control signal is received at a gate of the third transistor, and the complementary indicator node is pulled up to a high voltage level when the control signal is active. In this example or any other example, the control signal is a second input carry signal. In this example or any other example, the input carry signal is inactive when the control signal is active, and wherein the control signal is inactive when the input carry signal is active. In this example or any other example, the output carry signal is generated based at least in part on the clock signal being active while the internal state signal is active. In this example or any other example, each shift register circuit is configured to receive a clear signal, and wherein the plurality of circuit elements is further configured to initialize the internal state signal and the output carry signal to a low voltage level based at least in part on the clear signal. In this example or any other example, the plurality of output circuits are driven by a plurality of gate clock signals, and a particular output circuit outputs its gate signal based at least in part on the plurality of gate clock signals and on the output carry signal generated by a corresponding shift register circuit of the plurality of shift register circuits.

In an example, a display device comprises: a plurality of image-forming components arranged in a grid, the grid including a plurality of rows; and a gate driver circuit, comprising: a plurality of shift register circuits configured to sequentially generate carry signals; and a plurality of output circuits respectively associated with the plurality of shift register circuits, each output circuit configured to generate a gate signal based at least in part on the carry signals, and each output circuit configured to supply the gate signal to an associated row of the plurality of rows; wherein each shift register circuit comprises a plurality of circuit elements configured to: receive an input carry signal and a clock signal; generate an internal state signal at an indicator node based at least in part on the input carry signal and the clock signal; generate an output carry signal based at least in part on the internal state signal; and prevent a through current path between a high potential voltage supply and a low potential voltage supply by disabling at least one transistor when the internal state signal is active. In this example or any other example, the plurality of circuit elements include a first transistor coupled to the high potential voltage supply through a source of the first transistor, and coupled to the indicator node through a drain of the first transistor, wherein the input carry signal is received at a gate of the first transistor, and the indicator node is pulled up to the high voltage level when the input carry signal is active. In this example or any other example, the plurality of circuit elements include a second transistor between the first transistor and the indicator node, such that a gate of the second transistor is coupled to the drain of the first transistor, wherein a source of the second transistor is coupled to a complementary indicator node, a drain of the second transistor is coupled to the low potential voltage supply, and the complementary indicator node is pulled down to a low voltage level when the input carry signal is active. In this example or any other example, the plurality of circuit elements include a third transistor between the second transistor and the high potential voltage supply, wherein the third transistor is selectively enabled by a control signal, and wherein the at least one transistor disabled to prevent the through current path includes the third transistor. In this example or any other example, a source of the third transistor is coupled to the high potential voltage supply, a drain of the third transistor is coupled to the complementary indicator node, the control signal is received at a gate of the third transistor, and the complementary indicator node is pulled up to a high voltage level when the control signal is active. In this example or any other example, the control signal is a second input carry signal. In this example or any other example, the input carry signal is inactive when the control signal is active, and wherein the control signal is inactive when the input carry signal is active.

In an example, a method of operating a gate driver circuit for a display device comprises; sequentially generating carry signals using a plurality of shift register circuits, wherein generating an output carry signal for a shift register circuit includes: receiving an input signal and a clock signal at the shift register circuit; generating an internal state signal at an indicator node based at least in part on the input carry signal and the clock signal; generating the output carry signal based at least in part on the internal state signal; and preventing a through current path between a high potential voltage supply and a low potential voltage supply by disabling at least one transistor when the internal state signal is active; and generating gate signals using a plurality of output circuits respectively associated with the plurality of shift register circuits, each gate signal being generated based at least in part on one or more of the carry signals.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A gate driver circuit for a display device, the gate driver circuit comprising:

a plurality of shift register circuits configured to sequentially generate carry signals; and a plurality of output circuits respectively associated with the plurality of shift register circuits, each output circuit configured to generate a gate signal based at least in part on the carry signals;

wherein each shift register circuit comprises a plurality of circuit elements configured to:

receive an input carry signal and a clock signal;

generate an internal state signal at an indicator node based at least in part on the input carry signal and the clock signal;

generate an output carry signal based at least in part on the internal state signal; and prevent a through current path between a high potential voltage supply and a low potential voltage supply by disabling at least one transistor of a plurality of transistors when the internal state signal is active, wherein the plurality of transistors includes a first transistor and second transistor, wherein a source of the second transistor is coupled to a complementary indicator node, a drain of the second transistor is coupled to the low potential voltage supply, and the complementary indicator node is pulled down to a low voltage level when the input carry signal is active, and wherein the second transistor is between the first transistor and the indicator node, such that a gate of the second transistor is coupled to a drain of the first transistor.

2. The gate driver circuit of claim 1, wherein the first transistor is coupled to the high potential voltage supply through a source of the first transistor, and coupled to the indicator node through the drain of the first transistor, wherein the input carry signal is received at a gate of the first transistor, and the indicator node is pulled up to a high voltage level when the input carry signal is active.

3. The gate driver circuit of claim 1, wherein the indicator node is at a high voltage level and the complementary indicator node is at the low voltage level when the output carry signal is active.

4. The gate driver circuit of claim 1, wherein the plurality of circuit elements include a capacitor between the high potential voltage supply and the complementary indicator node.

5. The gate driver circuit of claim 1, wherein the plurality of circuit elements include a third transistor between the second transistor and the high potential voltage supply, wherein the third transistor is selectively enabled by a control signal, and wherein the at least one transistor disabled to prevent the through current path includes the third transistor.

6. The gate driver circuit of claim 5, wherein a source of the third transistor is coupled to the high potential voltage supply, a drain of the third transistor is coupled to the complementary indicator node, the control signal is received at a gate of the third transistor, and the complementary indicator node is pulled up to a high voltage level when the control signal is active.

7. The gate driver circuit of claim 5, wherein the control signal is a second input carry signal.

8. The gate driver circuit of claim 5, wherein the input carry signal is inactive when the control signal is active, and wherein the control signal is inactive when the input carry signal is active.

9. The gate driver circuit of claim 1, wherein the output carry signal is generated based at least in part on the clock signal being active while the internal state signal is active.

10. The gate driver circuit of claim 1, wherein each shift register circuit is configured to receive a clear signal, and wherein the plurality of circuit elements is further configured to initialize the internal state signal and the output carry signal to the low voltage level based at least in part on the clear signal.

11. The gate driver circuit of claim 1, wherein the plurality of output circuits are driven by a plurality of gate clock signals, and a particular output circuit outputs its gate signal based at least in part on the plurality of gate clock signals and on the output carry signal generated by a corresponding shift register circuit of the plurality of shift register circuits.

12. A display device, comprising:

a plurality of image-forming components arranged in a grid, the grid including a plurality of rows; and a gate driver circuit, comprising:

a plurality of shift register circuits configured to sequentially generate carry signals; and a plurality of output circuits respectively associated with the plurality of shift register circuits, each output circuit configured to generate a gate signal based at least in part on the carry signals, and each output circuit configured to supply the gate signal to an associated row of the plurality of rows;

wherein each shift register circuit comprises a plurality of circuit elements configured to:

receive an input carry signal and a clock signal;

generate an internal state signal at an indicator node based at least in part on the input carry signal and the clock signal;

generate an output carry signal based at least in part on the internal state signal; and prevent a through current path between a high potential voltage supply and a low potential voltage supply by disabling at least one transistor of a plurality of transistors when the internal state signal is active, wherein the plurality of transistors includes a first transistor and second transistor, wherein a source of the second transistor is coupled to a complementary indicator node, a drain of the second transistor is coupled to the low potential voltage supply, and the complementary indicator node is pulled down to a low voltage level when the input carry signal is active, and wherein the second transistor is between the first transistor and the indicator node, such that a gate of the second transistor is coupled to a drain of the first transistor.

13. The display device of claim 12, wherein the first transistor is coupled to the high potential voltage supply through a source of the first transistor, and coupled to the indicator node through the drain of the first transistor, wherein the input carry signal is received at a gate of the first transistor, and the indicator node is pulled up to a high voltage level when the input carry signal is active.

14. The display device of claim 12, wherein the plurality of circuit elements include a third transistor between the second transistor and the high potential voltage supply, wherein the third transistor is selectively enabled by a control signal, and wherein the at least one transistor disabled to prevent the through current path includes the third transistor.

15. The display device of claim 14, wherein a source of the third transistor is coupled to the high potential voltage supply, a drain of the third transistor is coupled to the complementary indicator node, the control signal is received at a gate of the third transistor, and the complementary indicator node is pulled up to a high voltage level when the control signal is active.

16. The display device of claim 14, wherein the control signal is a second input carry signal.

17. The display device of claim 14, wherein the input carry signal is inactive when the control signal is active, and wherein the control signal is inactive when the input carry signal is active.

18. A method of operating a gate driver circuit for a display device, the method comprising:

sequentially generating carry signals using a plurality of shift register circuits, wherein generating an output carry signal for a shift register circuit includes:

receiving an input signal and a clock signal at the shift register circuit;

generating an internal state signal at an indicator node based at least in part on the input carry signal and the clock signal;

generating the output carry signal based at least in part on the internal state signal; and preventing a through current path between a high potential voltage supply and a low potential voltage supply by disabling at least one transistor of a plurality of transistors when the internal state signal is active, wherein the plurality of transistors includes a first transistor and second transistor, wherein a source of the second transistor is coupled to a complementary indicator node, a drain of the second transistor is coupled to the low potential voltage supply, and the complementary indicator node is pulled down to a low voltage level when the input carry signal is active, and wherein the second transistor is between the first transistor and the indicator node, such that a gate of the second transistor is coupled to a drain of the first transistor; and generating gate signals using a plurality of output circuits respectively associated with the plurality of shift register circuits, each gate signal being generated based at least in part on one or more of the carry signals.

* * * * *